(12) United States Patent
Zhai

(10) Patent No.: US 10,871,842 B2
(45) Date of Patent: Dec. 22, 2020

(54) FLEXIBLE DISPLAY DEVICE, FABRICATION METHOD AND ELECTRONIC DEVICE THEREOF

(71) Applicant: Shanghai Tianma Micro-Electronics Co., Ltd., Shanghai (CN)

(72) Inventor: Yingteng Zhai, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 10 days.

(21) Appl. No.: 16/258,945

(22) Filed: Jan. 28, 2019

(65) Prior Publication Data

US 2019/0171322 A1 Jun. 6, 2019

Related U.S. Application Data

(63) Continuation-in-part of application No. 15/692,642, filed on Aug. 31, 2017, now Pat. No. 10,234,975.

(30) Foreign Application Priority Data

May 16, 2017 (CN) .......................... 2017 1 0342803

(51) Int. Cl.
*G06F 3/041* (2006.01)
*G09F 9/30* (2006.01)
(Continued)

(52) U.S. Cl.
CPC .......... *G06F 3/0412* (2013.01); *G02F 1/1343* (2013.01); *G02F 1/13338* (2013.01);
(Continued)

(58) Field of Classification Search
None
See application file for complete search history.

(56) References Cited

U.S. PATENT DOCUMENTS

2003/0197688 A1 10/2003 Aufderheide et al.
2013/0043068 A1 2/2013 Xie et al.
(Continued)

FOREIGN PATENT DOCUMENTS

CN 103928493 A 7/2014
CN 105826350 A 8/2016
(Continued)

*Primary Examiner* — Matthew Yeung
(74) *Attorney, Agent, or Firm* — Anova Law Group PLLC

(57) ABSTRACT

A flexible display device comprises at least one bending area provided with a bending axis and a non-bending area; a flexible display panel having a first surface for displaying images; a flexible insulating layer disposed on the first surface and divided into a plurality of flexible insulating blocks in the at least one bending area; and a touch control unit comprising a first touch control electrode layer in direct contact with the flexible insulating layer. The first touch control electrode layer includes a plurality of first touch control electrodes. Any one of the plurality of flexible insulating blocks corresponds to at least one of the plurality of first touch control electrodes. In a plane of the first surface for displaying images and in a direction perpendicular to the bending axis, a gap between any two adjacent flexible insulating blocks overlaps with a gap between two adjacent first touch control electrodes.

17 Claims, 23 Drawing Sheets

(51) Int. Cl.
*G02F 1/1333* (2006.01)
*G02F 1/1343* (2006.01)
*G06F 3/044* (2006.01)
*H05K 1/03* (2006.01)

(52) U.S. Cl.
CPC .. *G02F 1/133305* (2013.01); *G02F 1/133345* (2013.01); *G06F 3/044* (2013.01); *G09F 9/301* (2013.01); *H05K 1/0393* (2013.01); *G06F 2203/04102* (2013.01); *G06F 2203/04112* (2013.01)

(56) References Cited

U.S. PATENT DOCUMENTS

| | | |
|---|---|---|
| 2013/0082970 A1 | 4/2013 | Frey et al. |
| 2013/0257786 A1 | 10/2013 | Brown |
| 2013/0300677 A1 | 11/2013 | Kim et al. |
| 2014/0232956 A1 | 8/2014 | Kwon et al. |
| 2014/0292714 A1 | 10/2014 | Lee et al. |
| 2015/0060125 A1* | 3/2015 | Stevenson ............ H05K 3/0023 174/261 |
| 2016/0195997 A1 | 7/2016 | Lee et al. |
| 2017/0364187 A1* | 12/2017 | Zhai ........................ G06F 3/044 |
| 2019/0064958 A1* | 2/2019 | Liu ........................ G06F 3/044 |

FOREIGN PATENT DOCUMENTS

| | | |
|---|---|---|
| CN | 106024840 A | 10/2016 |
| CN | 206022368 U | 3/2017 |

\* cited by examiner

FLEXIBLE DISPLAY DEVICE, FABRICATION METHOD AND ELECTRONIC DEVICE THEREOF

CROSS-REFERENCES TO RELATED APPLICATIONS

This application is a continuation-in-part (CIP) application of U.S. patent application Ser. No. 15/692,642, filed on Aug. 31, 2017, which claims the priority of Chinese Patent Application No. CN201710342803.9, filed on May 16, 2017, the entire contents of which are incorporated herein by reference.

FIELD OF THE DISCLOSURE

The present disclosure generally relates to the organic electroluminescent technology and, more particularly, relates to a flexible display device, a flexible display device fabrication method and an electronic device thereof.

BACKGROUND

Organic light-emitting diodes (OLED), also known as organic electroluminescent displays, are emerging as the next generation of flat display technology, because of their various advantages such as self-luminous, wide viewing angle, fast response, high luminous efficiency, wide color gamut, low operation voltage, and flexibility, etc. In an existing OLED display device, a touch control panel and an OLED display panel are often integrated to achieve an integration of the touch control function and the display function.

FIG. 1 illustrates a schematic cross-sectional view of an existing OLED display device. As shown in FIG. 1, the OLED display device includes a touch control panel 10 and an OLED display panel 20. The OLED display panel 20 has a first side where images are displayed and an opposite side, and the touch control panel 10 is disposed on the first side of the OLED display panel 20. The OLED display panel 20 at least includes an array substrate 21, a light-emitting function layer 22, a cathode 23 for an OLED light-emitting device, and a thin film encapsulation layer 24. Touch control electrodes in the touch control panel 10 are in direct contact with the thin film encapsulation layer 24. However, a large parasitic capacitance is often formed between the cathode 23 and the touch control electrodes, resulting in a large load between the cathode 23 and the touch control electrodes.

The disclosed flexible display device, fabrication method and electronic device thereof are directed to solve one or more problems set forth above and other problems.

BRIEF SUMMARY OF THE DISCLOSURE

One aspect of the present disclosure provides a flexible display device. The flexible display device comprises at least one bending area and a non-bending area, wherein the bending area is provided with a bending axis; a flexible display panel having a first surface for displaying images; a flexible insulating layer disposed on the first surface of the flexible display panel, wherein in the at least one bending area, the flexible insulating layer is divided into a plurality of flexible insulating blocks, and the flexible insulating layer has a first surface facing the flexible display panel and an opposite second surface; and a touch control unit disposed on the second surface of the flexible insulating layer, wherein the touch control unit comprises a first touch control electrode layer in direct contact with the flexible insulating layer, and the first touch control electrode layer includes a plurality of first touch control electrodes. Any one of the plurality of flexible insulating blocks corresponds to at least one of the plurality of first touch control electrodes. In a plane of the first surface for displaying images and in a direction perpendicular to the bending axis, a gap between any two adjacent flexible insulating blocks overlaps with a gap between two adjacent first touch control electrodes Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

FIG. 7B illustrates a BB'-sectional view of an exemplary flexible display device in FIG. 7A consistent with disclosed embodiments;

DETAILED DESCRIPTION

Figure 1:
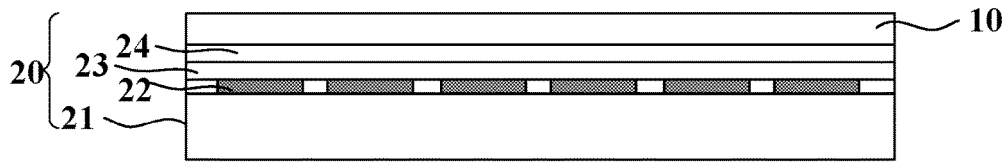
FIG. 1 illustrates a schematic cross-sectional view of an existing OLED display device.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted.

Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

The present disclosure provides an improved flexible display device, which may be able to reduce the load of the flexible display device without degrading the bending performance of the flexible display device.

Figure 2A:
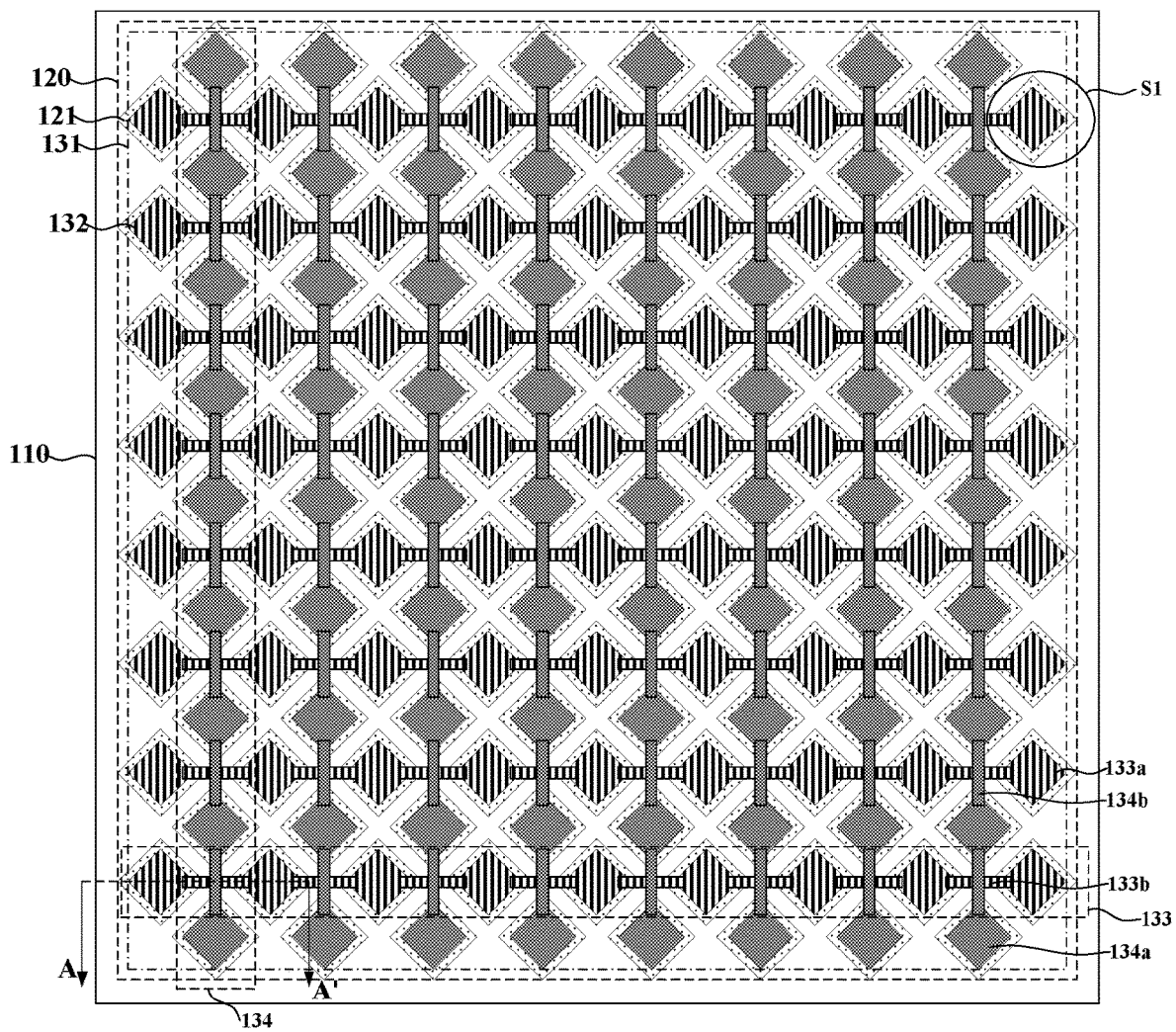
FIG. 2A illustrates a schematic top view of an exemplary flexible display device consistent with disclosed embodiments.
Figure 2B:
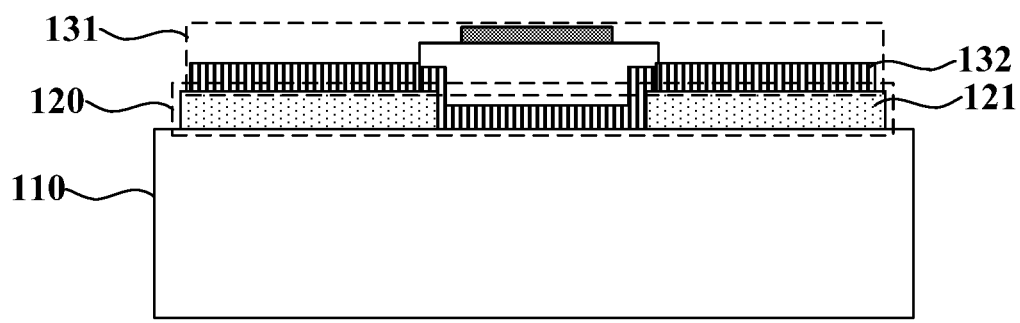
FIGS. 2B-2C illustrate AA'-sectional views of an exemplary flexible display device in FIG. 2A consistent with disclosed embodiments.
Figure 2C:
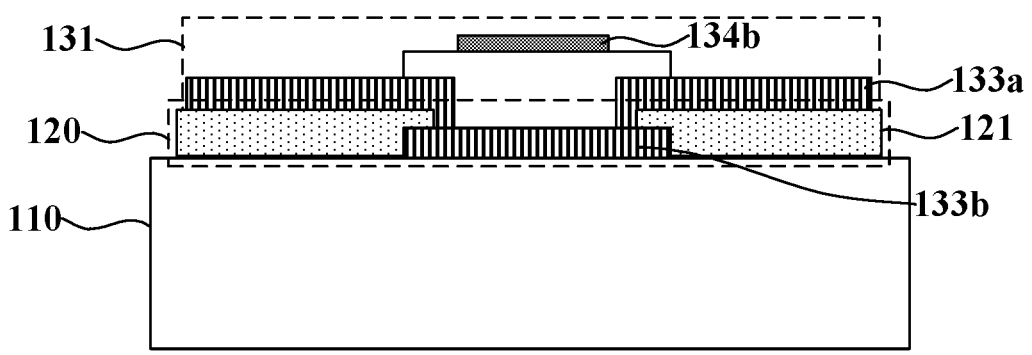

FIG. 2A illustrates a schematic top view of an exemplary flexible display device consistent with disclosed embodiments. FIGS. 2B-2C illustrate AA'-sectional views of an exemplary flexible display device in FIG. 2A consistent with disclosed embodiments.

As shown in FIGS. 2A-2C, the flexible display device may comprise a flexible display panel 110 having a first surface for displaying images, a flexible insulating layer 120 disposed on the first surface of the flexible display panel 110, and a touch control unit comprising a first touch control electrode layer 131 in direct contact with the flexible insulating layer 120. The flexible insulating layer 120 may be divided into a plurality of flexible insulating blocks 121. The flexible insulating layer 120 may have a first surface facing the flexible display panel 110 and an opposite second surface far away from the flexible display panel 110. The touch control unit may be disposed on the second surface of the flexible insulating layer 120.

The touch control electrode layer 131 may include a plurality of first touch control electrodes 132, and any one of the plurality of flexible insulating blocks 121 may correspond to at least one first touch control electrode 132. In a direction perpendicular to the flexible display panel 110, a gap between any two adjacent flexible insulating blocks 121 may overlap with a gap between two adjacent first touch control electrodes 132.

That is, when being projected onto the flexible display panel 110, the orthogonal projection of the gap between any two adjacent flexible insulating blocks 121 may overlap with the orthogonal projection of the gap between two adjacent first touch control electrodes 132. In one embodiment, as shown in FIGS. 2B-2C, when being projected onto the flexible display panel 110, the orthogonal projection of the gap between any two adjacent flexible insulating blocks 121 may fully cover the orthogonal projection of the gap between two adjacent first touch control electrodes 132.

The flexible display panel 110 may comprise at least one display electrode layer (not drawn in FIGS. 2A-2C). The touch control unit may comprise the first touch control electrode layer 131, which may overlap with the display electrode layer in a direction perpendicular to the flexible display panel 110. That is, when being projected onto the flexible display panel 110, the orthogonal projections of the display electrode layer and first touch control electrode layer 131 may overlap with each other. Thus, a parasitic capacitance may be generated between the display electrode layer and the first touch control electrode layer 131, which may result a substantially large load of the flexible display device.

To reduce the load of the flexible display device, the flexible insulating layer 120 may be disposed between the flexible display panel 110 and the touch control unit. On one hand, the flexible insulating layer 120 may not affect either the display function of the flexible display panel 110 or the touch control function of the touch control unit. On the other hand, the flexible insulating layer 120 may increase the distance between the flexible display panel 110 and the touch control unit, thereby reducing the parasitic capacitance between the flexible display panel 110 and the touch control unit and, accordingly, reducing the load of the flexible display device.

The flexible display panel 110 may include any appropriate type of flexible display panels capable of displaying videos and/or images, such as plasma display panels, field emission display panels, organic light-emitting diode (OLED) display panels, light-emitting diode (LED) display panels, liquid crystal display (LCD) panels, quantum dots (QDs) display panels, electrophoretic display panels, etc.

In one embodiment, the flexible display panel 110 may be a top emission type OLED display panel. An exemplary structure is shown in FIG. 3.

Figure 3:
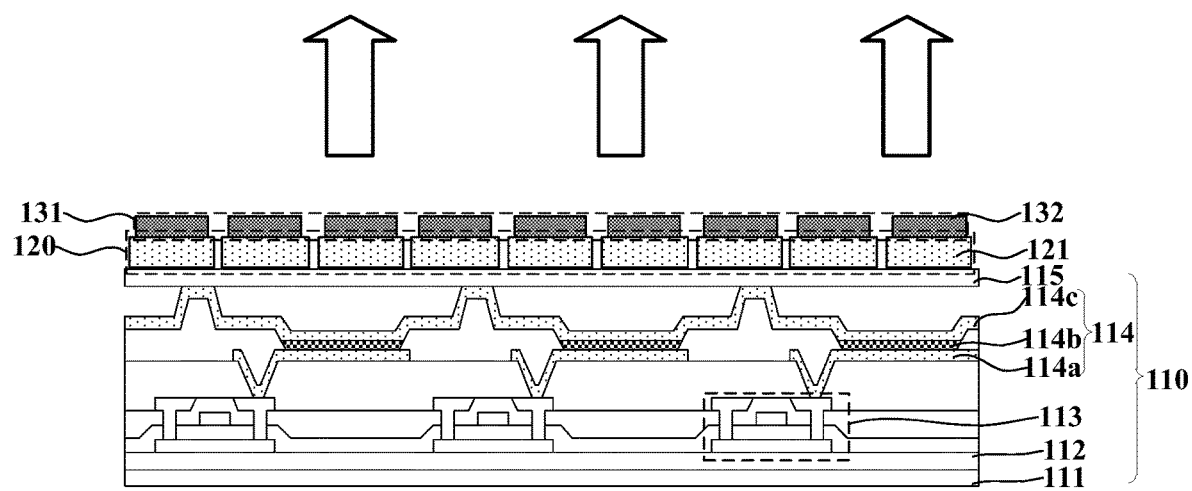
FIG. 3 illustrates a schematic cross-sectional view of another exemplary flexible display device consistent with disclosed embodiments.

As shown in FIG. 3, the flexible display panel 110 may comprise a flexible substrate 111, a thin-film-transistor (TFT) 113 array disposed on the flexible substrate 111, a plurality of light-emitting units 114 electrically connected to the TFT 113 array, and a thin film encapsulation layer 115 configured to encapsulate the plurality of light-emitting units 114.

The TFT array may comprise a plurality of TFTs 113. The flexible substrate 111 may be formed of any appropriate flexible insulating materials, such as polyimide, polycarbonate, polyether sulfone, polyethylene terephthalate, polyethylene naphthalate, polyarylate, and glass fiber-reinforced materials, etc. The flexible substrate 111 may be transparent, translucent or opaque. The flexible substrate 111 may be provided with a buffer layer 112 which covers the entire upper surface of the flexible substrate 111. The buffer layer 112 may be configured to block oxygen and moisture, and prevent moisture or impurities from diffusing through the flexible substrate 111. The buffer layer 112 may also provide a flat surface on the upper surface of the flexible substrate 111, facilitating the subsequent fabrication process.

The TFTs 113 may be disposed on the buffer layer 112, and the light-emitting units 114 may be disposed on the TFTs 113. The thin film encapsulation layer 115 may be disposed on the light-emitting units 114, and cover the light-emitting units 114 for preventing the light-emitting units 114 and other films from external moisture and oxygen. The thin film encapsulation layer 115 may comprise stacked organic layers and inorganic layers. The thin film encapsulation layer 115 may have a first surface facing the flexible substrate 111 and an opposite second surface far away from the flexible substrate 111. The flexible insulating layer 120 may be disposed on the second surface of the thin film encapsulation layer 115.

The light-emitting unit 114 may at least comprise a first electrode 114a, a light-emitting function layer 114b, and a second electrode 114c. The light emitted from the light-emitting function layer 114b may be transmitted through the second electrode 114c. The second surface of the thin film encapsulation layer 115 may be the first surface of the flexible display panel 110, in which the second surface of the thin film encapsulation layer 115 may be arranged far away from the flexible substrate 111, and the first surface of the flexible display panel 110 may be for displaying images.

The parasitic capacitance may be formed between the second electrode 114c of the flexible display panel 110 and the first touch control electrode layer 131. However, the flexible insulating layer 120, which is disposed between the first surface of the flexible display panel 110 and the touch control unit, may increase the distance between the second electrode 114c of the flexible display panel 110 and the first touch control electrode layer 131. Thus, the parasitic capacitance formed between the second electrode 114c and the first touch control electrode layer 131 may be reduced, and the load of the flexible display device may be reduced, accordingly.

In another embodiment, the flexible display panel may be an OLED display panel of a bottom emission type, or a double emission type, which is not limited by the present disclosure.

In one embodiment, the flexible insulating layer 120 may have a thickness of approximately 4 μm to 20 μm. The flexible insulating layer 120 may be made of an organic material, such as polymethylmethacrylate. When the thickness of the flexible insulating layer 120 is substantially small, the load of the flexible display device may not be obviously reduced. When the thickness of the flexible insulating layer 120 is substantially large, the display effect and the bending capability of the flexible display device may be affected.

Further, organic materials may be able to form a substantially thick flexible insulation layer, while inorganic materials may not be able to form a substantially thick flexible insulation layer. Thus, the flexible insulation layer made of organic materials may be able to significantly reduce the parasitic capacitance. Even an inorganic insulation layer has a same thickness as the flexible insulation layer made of organic materials, the stress of the inorganic insulation layer may be much larger than the stress of the flexible insulation layer made of organic materials. Thus, even the inorganic insulation layer has the same thickness as the flexible insulation layer made of organic materials, the bending capability of the flexible insulation layer made of organic materials may be significantly superior to the bending capability of the inorganic insulating layer.

In summary, through disposing the flexible insulating member 121 formed of an organic material beneath the first touch control electrode 132, the bending capability of the flexible display device may be increased, and the bending stress of the flexible display device may be effectively alleviated. It should be noted that, the thickness and material of the flexible insulating layer in the disclosed embodiments are for illustrative purposes, and are not intended to limit the scope of the present disclosure. In practical applications, the thickness and material of the flexible insulating layer may be determined according to various application scenarios, as long as the function of the flexible display device is not affected. In certain embodiments, the material of the flexible insulating layer may include acrylic.

In one embodiment, the touch control unit may be a capacitive touch control unit. For example, as shown in FIGS. 2A-2C, the touch control unit may be a touch control unit based on mutual capacitance, which may include a first touch control electrode layer 131. The first touch control electrode layer 131 may include a plurality of first touch control electrodes 132 each of which is a block electrode.

The plurality of first touch control electrodes 132 may be arranged in a plurality of rows of touch driving electrodes 133 and a plurality of columns of touch sensing electrodes 134. At the touch detection stage, the touch detection circuit (not drawn in FIGS. 2A-2C) may apply a touch driving signal to the touch driving electrodes 133, and then acquire a touch sensing signal from the touch sensing electrodes 134. The touch detection circuit may determine the touch position according to the touch driving signal and the touch sensing signal.

In another embodiment, the touch control unit may be a touch control unit based on self-capacitance or based on both mutual capacitance and self-capacitance, which is not limited by the present disclosure.

As discussed above, through disposing the flexible insulating layer 120 in the flexible display device, the load of the flexible display device may be reduced. However, the thickness of the flexible display device may be increased, which may increase the internal stress of the flexible insulating layer 120 when the flexible display device is bent and lead to cracks in the flexible insulating layer 120. Meanwhile, when bending the flexible display device, the stress between the flexible insulating layer 120 and the flexible display panel 110, as well as the stress between the flexible insulating layer 120 and the touch control unit may be increased. As a result, various layers in the flexible display device may be more likely to fall off.

To prevent the bending performance of the flexible display device from being affected, the flexible insulating layer 120 may be divided into a plurality of flexible insulating blocks 121, any one of the plurality of flexible insulating blocks 121 may correspond to one first touch control electrode 132, and in a direction perpendicular to the flexible display panel 110, the gap between any two adjacent flexible insulating blocks 121 may overlap with the gap between two adjacent first touch control electrodes 132. Thus, on one hand, when bending the flexible display device, the internal stress of the flexible insulating blocks 121 may be substantially small, and the flexible insulating layer 120 may be less likely to crack. Meanwhile, the stress between the flexible insulating blocks 121 and the flexible display panel 110, as well as the stress between the flexible insulating blocks 121 and the first touch control electrodes 132 may be substantially small, such that the various layers in the flexible display device may be less likely to fall off.

On the other hand, because any one of the plurality of flexible insulating blocks 121 may correspond to one first touch control electrode 132, the bending direction of the flexible display device may not be confined by the flexible insulating layer, and the flexible display device may be bent in any direction. For example, the flexible display device may be laterally bent or longitudinally bent, or may be bent in a diagonal direction.

Figure 2D:
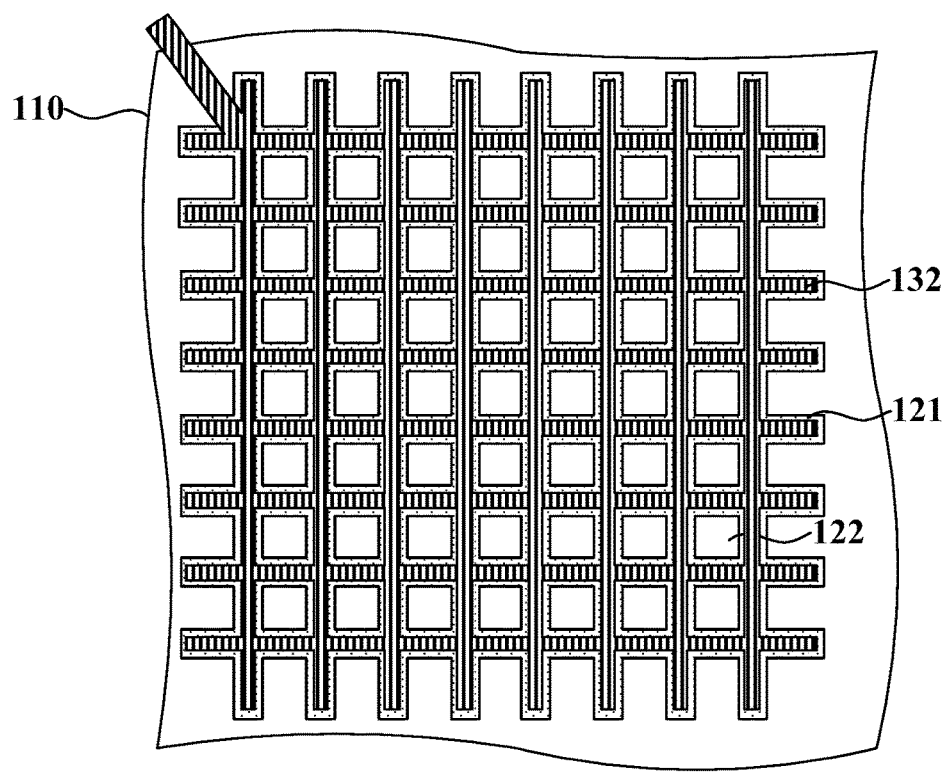
FIG. 2D illustrates an enlarged top view of an S1 region in an exemplary flexible display device in FIG. 2A consistent with disclosed embodiments.

FIG. 2D illustrates an enlarged top view of an S1 region in an exemplary flexible display device in FIG. 2A consistent with disclosed embodiments.

As shown in FIG. 2D, the first touch control electrode 132 may be a metal mesh, i.e., a metal grid with a plurality of openings. Accordingly, each flexible insulating block 121 may include a plurality of grooves 122 extending through the flexible insulating block 121, in a direction perpendicular to the flexible display panel 110, the groove 122 may fall within the opening of the metal grid. That is, when being projected onto the first touch control electrode 132, the orthogonal projection of the groove 122 may fall within the opening of the metal grid.

On one hand, metals have the advantages of substantially high conductivity and bending capability, and as compared to ITO, metals have a lower cost and is less likely to be broken. On the other hand, the flexible insulation layer and the metal mesh may be fabricated by exposing through a mask or by printing, and the fabrication process may be substantially simple. Thus, the first touch control electrode of metal mesh may have various advantages, such as high transparency, low resistance, and low cost, etc. When the flexible display device is bent, the stress inside the flexible insulating block 121 may be substantially small, and the stress between the flexible insulating block 121 and the other layers may also be substantially small. Thus, the various layers in the flexible display device may be less likely to fall off, the cracks in the flexible insulating layer 120 may be suppressed, and the overall bending performance of the flexible display device may be improved.

It should be noted that, the shape of the openings in the metal grid and the shape of the grooves 122 in the flexible insulating block 121 shown in FIG. 2D are for illustrative purposes, and are not intended to limit the scope of the present disclosure. In practical applications, the shape of the openings in the metal grid and the shape of the grooves 122 in the flexible insulating block 121 may be determined according to various application scenarios. The shape of the openings in the metal grid may be the same as or different from the shape of the grooves 122 in flexible the insulating block 121.

Referring to FIG. 2A and FIG. 2C, the plurality of first touch control electrodes 132 may be arranged in a plurality of rows of touch driving electrodes 133 and a plurality of columns of touch sensing electrodes 134. In particular, the first touch control electrode configured as the touch driving electrode 133 is denoted as 133*a*, the connecting line of two adjacent first touch control electrodes 133*a* in the touch driving electrode 133 is denoted as 133*b*, the first touch control electrode configured as the touch sensing electrode 134 is denoted as 134*a*, and the connecting line of two adjacent first touch control electrodes 134*a* in the touch sensing electrodes 134 is denoted as 134*b*.

Because each flexible insulating block 121 corresponds to a first touch control electrode 132, the connecting line 133*b* in the touch driving electrode 133 may be connected to two adjacent first touch control electrodes 133*a* via the surface of the flexible display panel 110. As shown in FIG. 2C, the connecting line 133*b* may extend to the bottom surface of the flexible insulating block 121, and the first touch control electrode 133*a* may extend along the edge of the flexible insulating block 121 to be connected to the connecting line 133*b*. Thus, the connecting line 133*b* may be less likely to be broken when being bent, thereby reducing the risk of the electrical disconnections of two adjacent first touch control electrodes.

Figure 4A:
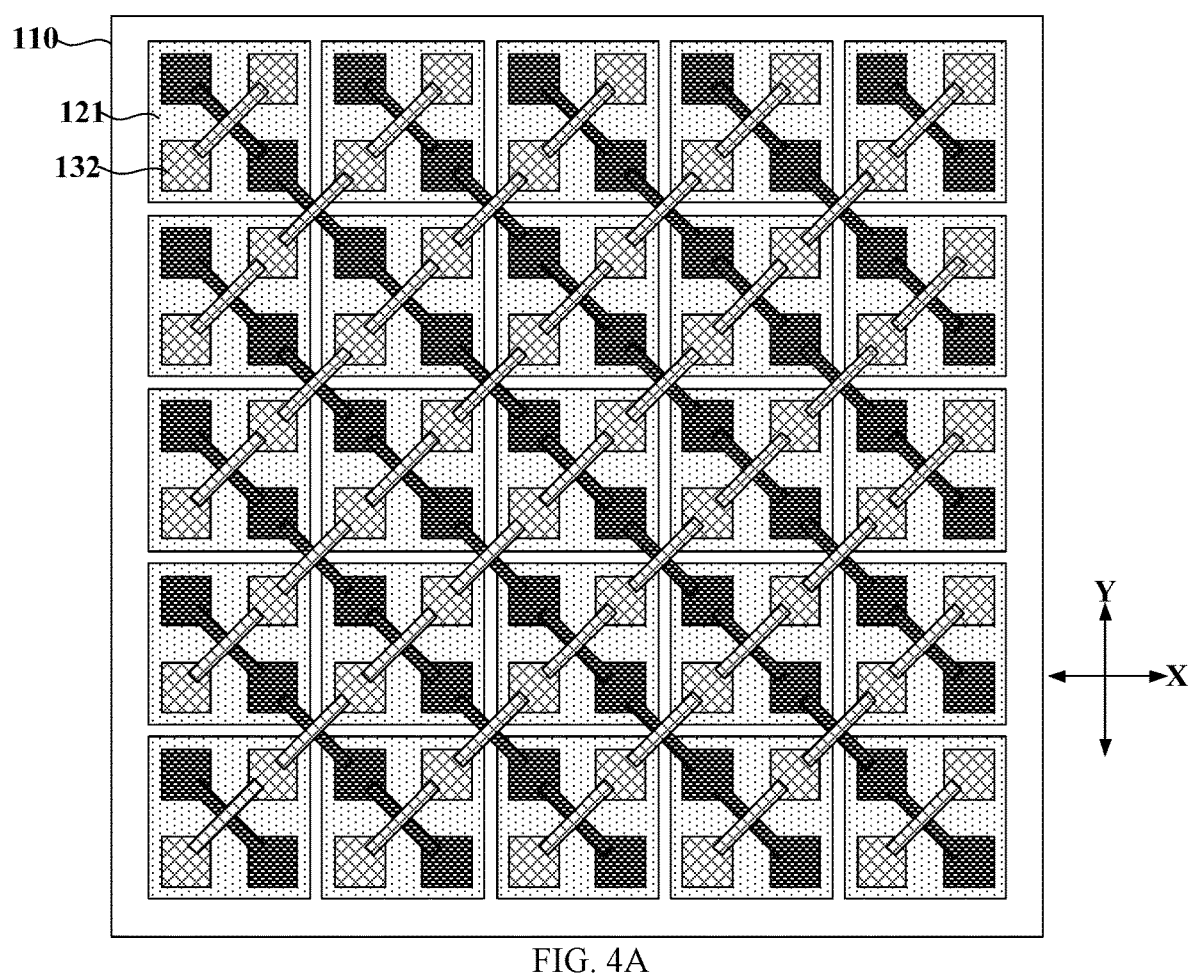
FIGS. 4A-4B illustrate schematic top views of exemplary flexible display devices consistent with disclosed embodiments.
Figure 4B:
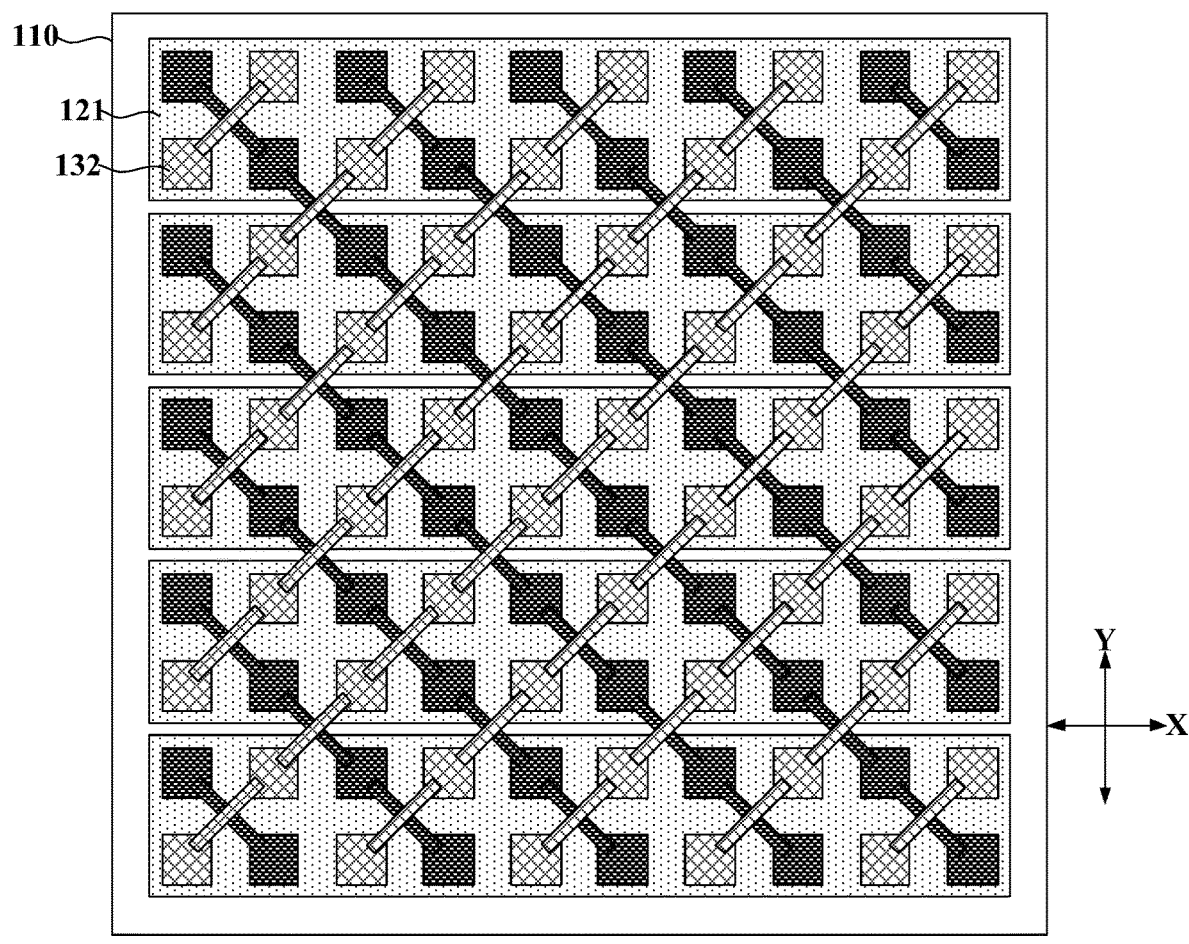

FIGS. 4A-4B illustrate schematic top views of exemplary flexible display devices consistent with disclosed embodiments. The similarities between FIGS. 4A-4B and FIG. 2A are not repeated here, while certain difference may be explained.

As shown in FIG. 4A, any one of the plurality of flexible insulating blocks 121 may correspond to a plurality of first touch control electrodes 132. In a direction perpendicular to the flexible display panel 110, the gap between any two adjacent flexible insulating blocks 121 may overlap with the gap between two adjacent first touch control electrodes 132. In particular, through dividing the flexible insulating layer 120 into a plurality of flexible insulating blocks 121, the stress inside the flexible insulating block 121 may be reduced and, meanwhile, the stress between the flexible insulating block 121 and the other films may also be reduced. Thus, the various layers in the flexible display device may be less likely to fall off, the cracks in the flexible insulating layer 120 may be suppressed, and the overall bending performance of the flexible display device may be improved.

It should be noted that, the flexible insulating layer 120 in the flexible display device shown in FIG. 4A may be divided into a plurality of flexible insulating blocks 121 arranged in an array, such that the flexible insulating layer may not confine the bending direction of the flexible display device. That is, the flexible display device may be bent in any direction. For example, the flexible display device may be bent in the X-direction or in the Y-direction, or in other directions.

As shown in FIG. 4B, the flexible insulating layer 120 in the flexible display device may be divided into a plurality of flexible insulating blocks 121. The plurality of flexible insulating blocks 121 may be flexible insulating stripes 121 extending in a first direction and arranged in a second direction. In particular, the first direction may be perpendicular to the second direction, and the first direction may be perpendicular to the bending direction of the flexible display device.

In one embodiment, as shown in FIG. 4B the first direction and the second direction may be the X-direction and the Y-direction, respectively. The bending direction of the flexible display device may be the Y-direction. Thus, when bending the flexible display device, the stress inside the flexible insulating stripes 121 may be substantially small and, meanwhile, the stress between the flexible insulating stripes 121 and the other layers may also be substantially small. Thus, not only the stress inside the flexible insulating layer 120 may be reduced, but also the stress between the flexible insulating layer 120 and the other layers may be reduced. Accordingly, the various layers in the flexible display device may be less likely to fall off, the cracks in the flexible insulating layer 120 may be suppressed, and the overall bending performance of the flexible display device may be improved.

It should be noted that, the flexible insulating layer 120 in the flexible display device shown in FIG. 4B may be divided into a plurality of flexible insulating stripes 121 extending in the X-direction and arranged the Y-second direction, such that the bending direction of the flexible display device may be fixed in one direction, i.e., the Y-direction. On the other hand, increasing the thickness of the flexible insulating layer 120 may allow the flexible display device to be bent in the fixed Y-direction, but not allow the flexible display device to be easily bent in the X direction.

That is, through dividing the flexible insulation layer 120 in different ways, the flexible display device may have different bending properties.

In the disclosed embodiments, through disposing the flexible insulating layer between the first surface of the flexible display panel and the touch control unit, the distance between the flexible display panel and the touch control unit may be increased, the parasitic capacitance formed between the flexible display panel and the touch control unit may be reduced and, accordingly, the load of the flexible display device may be reduced.

Further, the flexible insulating layer may be divided into a plurality of flexible insulating blocks, and any one of the plurality of flexible insulating blocks may correspond to at least one first touch control electrode. In a direction perpendicular to the flexible display panel, the gap between any two adjacent flexible insulating blocks may overlap with the gap between two adjacent first touch control electrodes. Thus, when bending the flexible display device, the internal stress of the flexible insulating blocks, the stress between the flexible insulating blocks and the flexible display panel, as well as, the stress between the flexible insulating blocks and the first touch control electrodes may be substantially small.

Accordingly, the various layers in the flexible display panel may be less likely to fall off, and the cracks in the flexible insulating layer may also be suppressed. That is, the flexible display device may be able to reduce the load of the flexible display device without degrading the bending performance of the flexible display device.

The present disclosure also provides exemplary flexible display devices in which the structure of the flexible insulating layer and touch control unit are different from the structure of the flexible insulating layer and touch control unit shown FIGS. 2A-4B. The similarities of the flexible display devices are not repeated here, while certain difference may be explained.

FIGS. 5A-5E illustrate schematic top views of exemplary flexible display devices consistent with disclosed embodiments. The similarities between FIGS. 5A-5E and FIGS. 2A-4B are not repeated here, while certain difference may be explained.

Figure 5A:
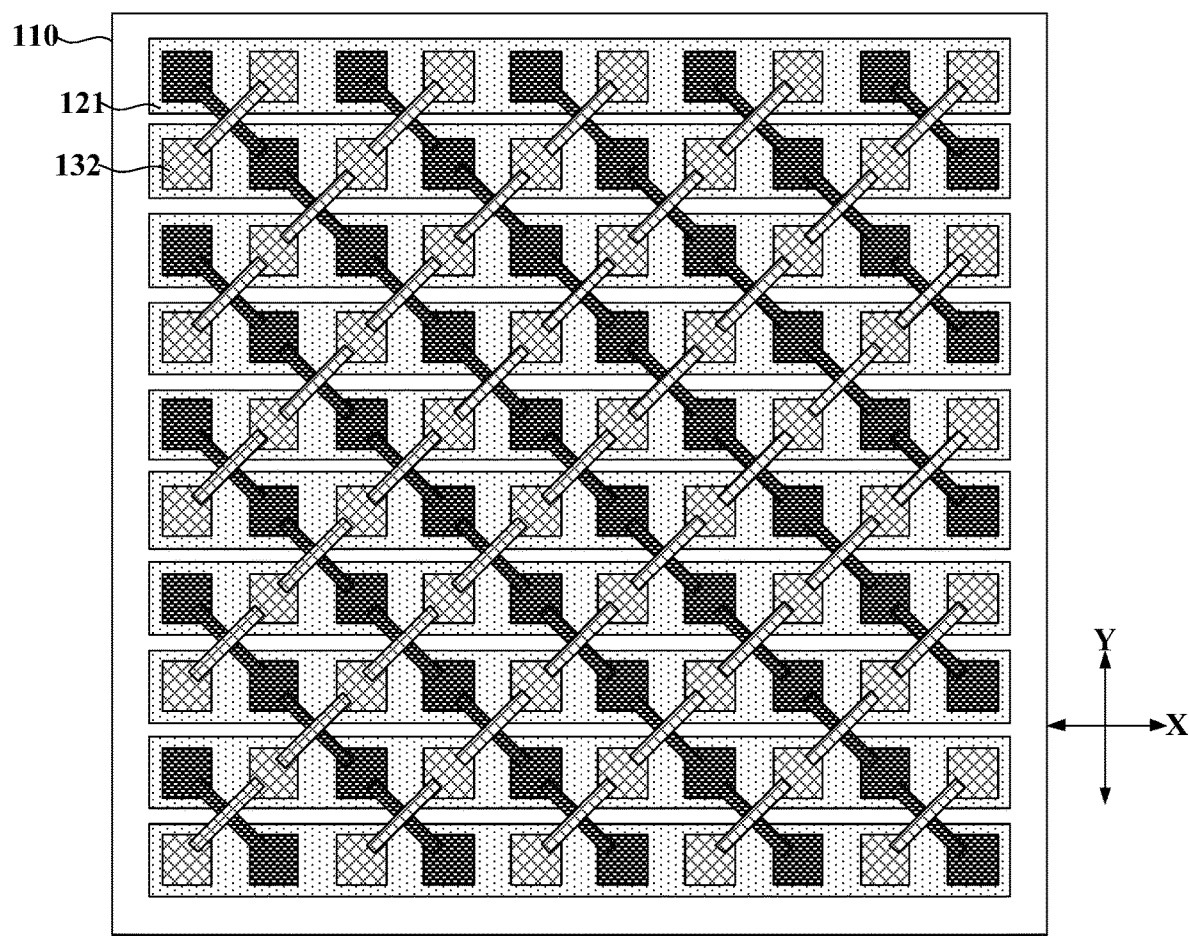
FIGS. 5A-5E illustrate schematic top views of exemplary flexible display devices consistent with disclosed embodiments.

As shown in FIG. 5A, the flexible insulating layer 120 in the flexible display device may be divided into a plurality of flexible insulating blocks 121. The plurality of flexible insulating blocks 121 may be flexible insulating stripes 121 extending in a first direction and arranged in a second direction. The first direction may be perpendicular to the second direction, and the first direction may be perpendicular to the bending direction of the flexible display device.

The plurality of first touch control electrodes 132 may be arranged in an array, in which the row direction of the array may be perpendicular to the bending direction of the flexible display device. One flexible insulating block 121 may correspond to at least one row of the first touch control electrodes 132 (i.e., one first touch control electrode row). In one embodiment, as shown in FIG. 5A, the first direction and the second direction may be the X-direction and the Y-direction, respectively. The bending direction of the flexible display device may be the Y-direction.

Further, the bending direction of the flexible display device may be bent in a fixed direction, i.e., the Y-direction. Through increasing the thickness of the flexible insulating layer 120, the flexible display device may be not easily bent in the X-direction.

Figure 5B:
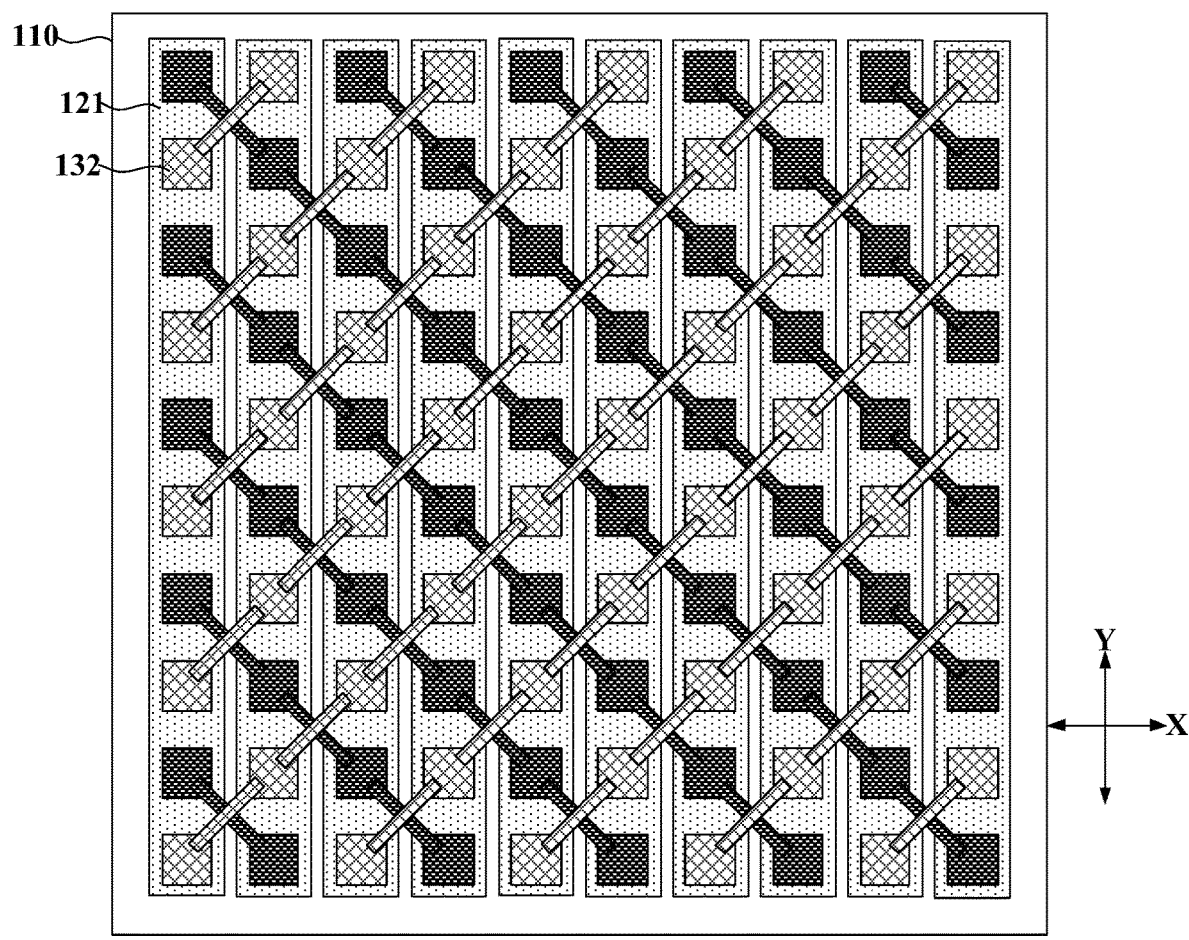

As shown in FIG. 5B, the flexible insulating layer 120 in the flexible display device may be divided into a plurality of flexible insulating blocks 121. The plurality of flexible insulating blocks 121 may be flexible insulating stripes 121 extending in a first direction and arranged in a second direction. The first direction may be perpendicular to the second direction, and the first direction may be perpendicular to the bending direction of the flexible display device.

The plurality of first touch control electrodes 132 may be arranged in an array, in which the column direction of the array may be perpendicular to the bending direction of the flexible display device. One flexible insulating block 121 may correspond to at least one column of the first touch control electrodes 132 (i.e., one first touch control electrode column). In one embodiment, as shown in FIG. 5B, the first direction and the second direction may be the X-direction and the Y-direction, respectively. The bending direction of the flexible display device may be the X-direction.

Further, the bending direction of the flexible display device may be in a fixed direction, i.e., the X-direction. Through increasing the thickness of the flexible insulating layer 120, the flexible display device may be not easily bent in the Y-direction.

Figure 5C:
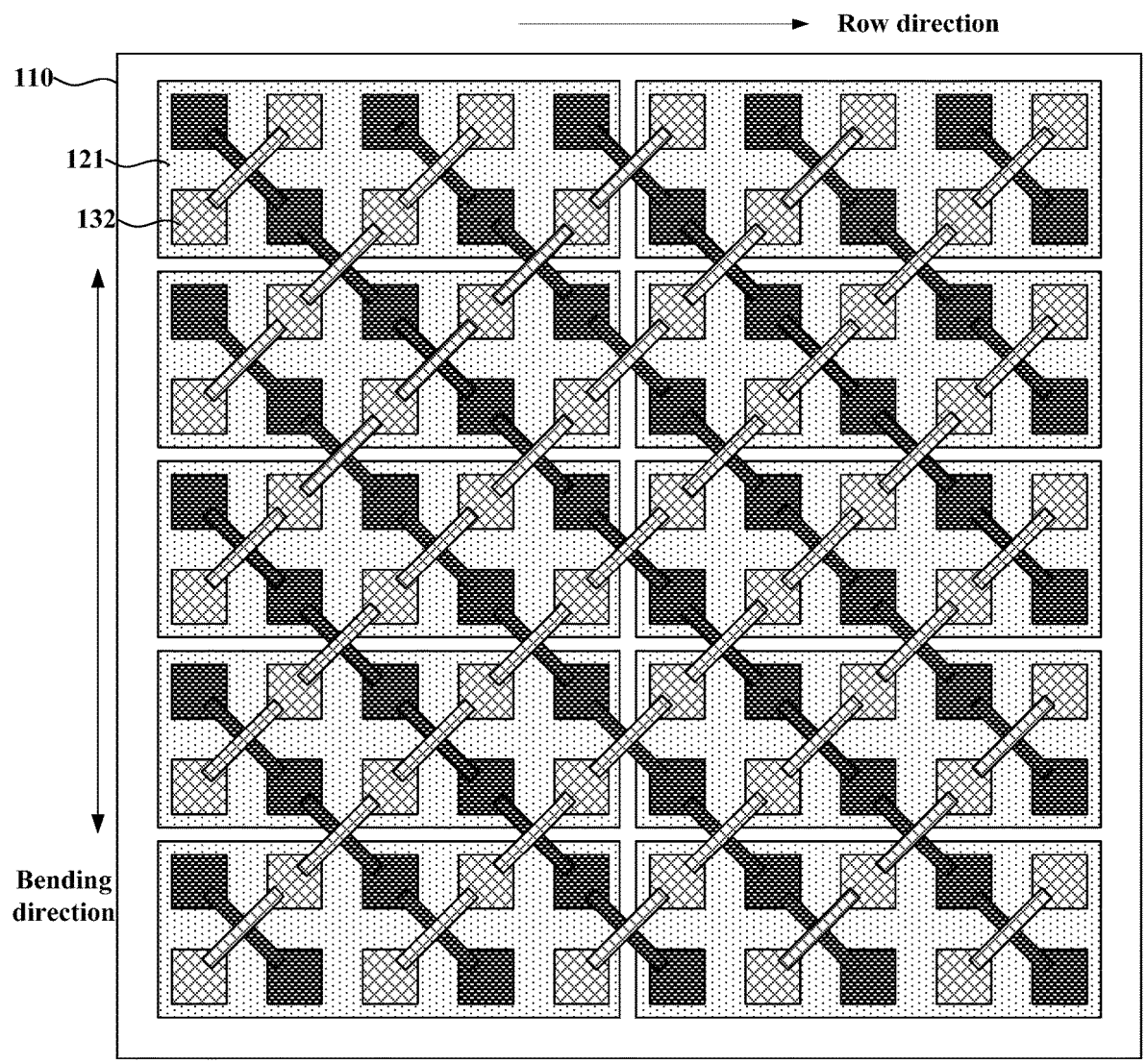

As shown in FIG. 5C, the plurality of flexible insulating blocks 121 may be arranged in an array, in which the row direction of the array may be perpendicular to the bending direction of the flexible display device.

Figure 5D:
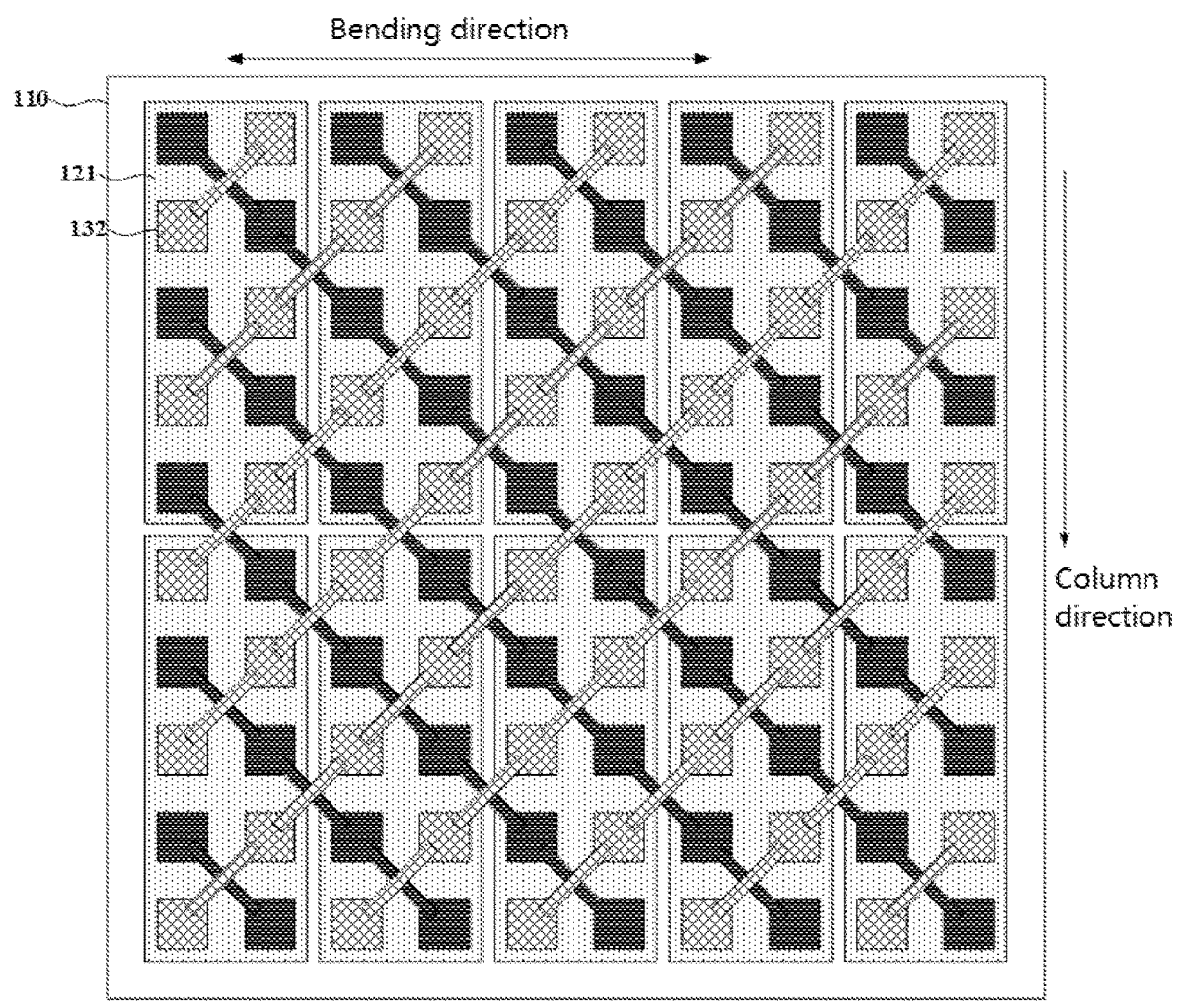

As shown in FIG. 5D, the plurality of flexible insulating blocks 121 may be arranged in an array, in which the column direction of the array may be perpendicular to the bending direction of the flexible display device.

Figure 5E:
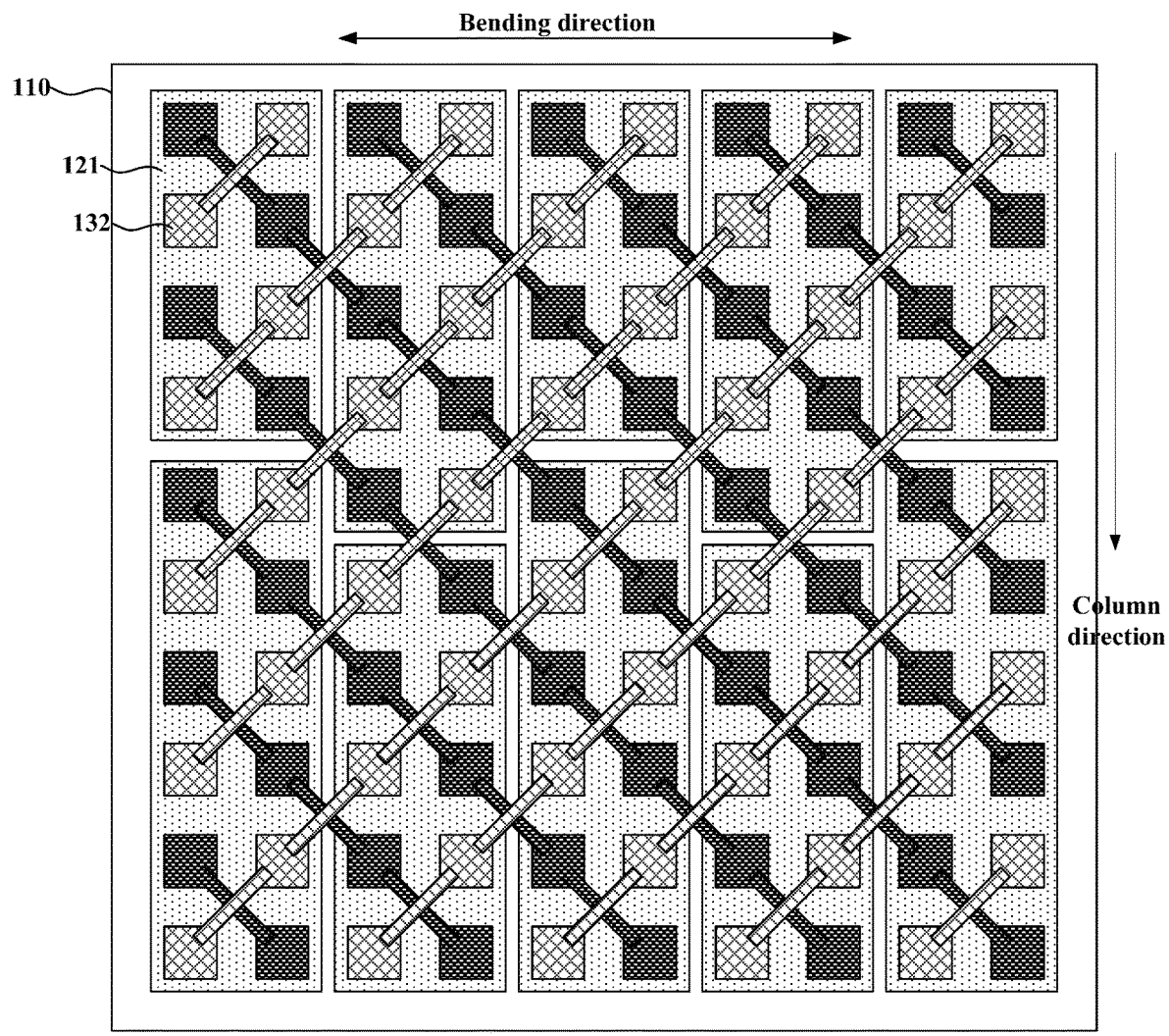

As shown in FIG. 5E, the flexible insulating layer 120 in the flexible display device may be divided into a plurality of flexible insulating blocks 121. Each flexible insulating block 121 may correspond to a different number of first touch control electrodes 132. The plurality of flexible insulating blocks 121 may include a plurality of columns of flexible insulating blocks 121 (i.e., a plurality of flexible insulating block columns), in which the column direction may be perpendicular to the bending direction of the flexible display device.

According to FIGS. 5A-5E, the extending direction of the flexible insulating block 121 may be perpendicular to the bending direction of the flexible display device, and the arrangement direction of the flexible insulating block 121 may be parallel to the bending direction of the flexible display device.

It should be noted that, the accompany drawings merely show the bending direction of the flexible display device, which indicates the bending properties of the flexible display device. The parameters related to the bending properties of the flexible display device may also include a bending axis, which is perpendicular to the bending direction.

Figure 6A:
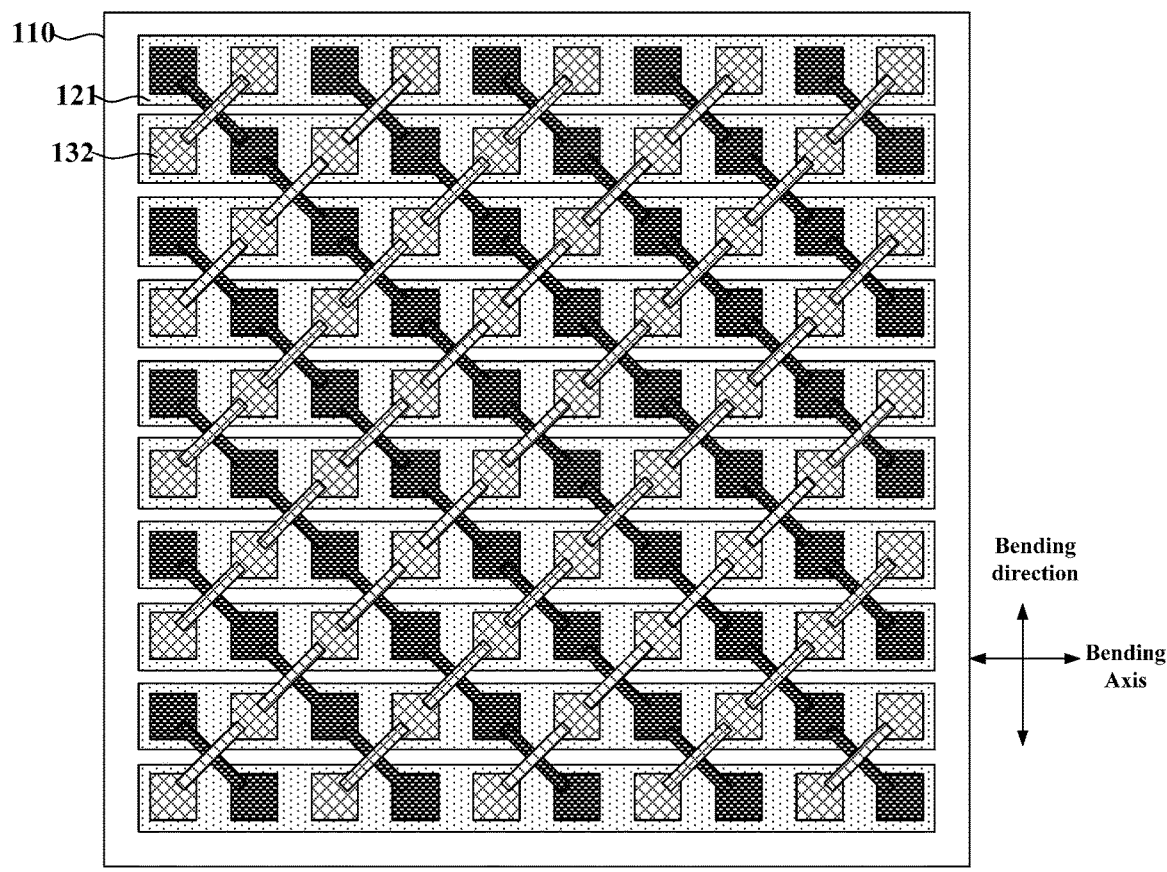
FIGS. 6A-6B illustrate schematic views of an exemplary bending state of an exemplary flexible display device in FIG. 5A consistent with disclosed embodiments.
Figure 6B:
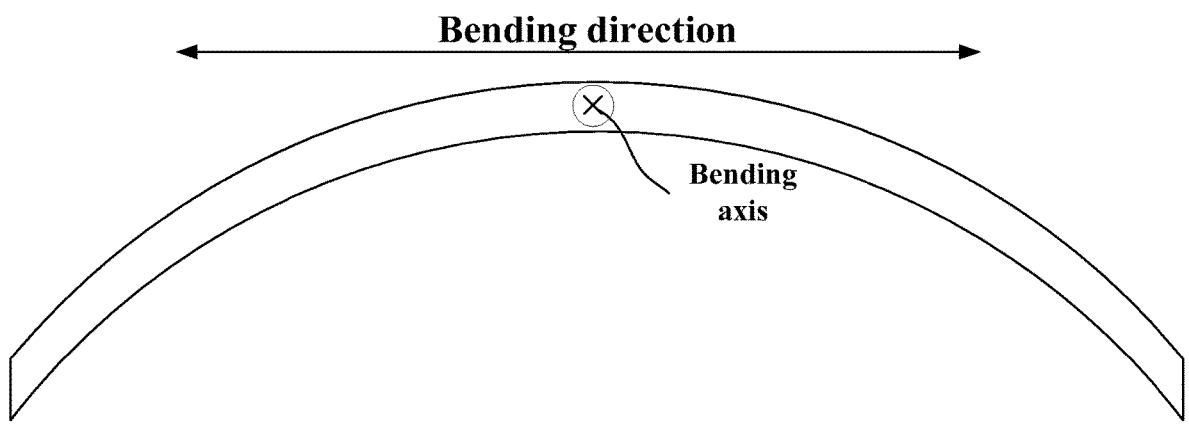

FIGS. 6A-6B illustrate schematic views of the bending axis and bending direction of an exemplary flexible display device in FIG. 5A. In particular, FIG. 6A illustrates a schematic top view of the bending state of the flexible display device in FIG. 5A, and FIG. 6B illustrates a schematic cross-sectional view of the bending state of the flexible display device in FIG. 5A.

As shown in FIGS. 6A-6B, the flexible display device may have a bending axis and a bending direction, and the bending axis may be perpendicular to the bending direction. The flexible insulating blocks 121 may be extended in a direction parallel to the bending axis, but arranged in a direction parallel to the bending direction.

In one embodiment, the touch control unit may be a touch control unit based on mutual capacitance. The touch control unit may include a plurality of first touch control electrodes 132 arranged in an array. The plurality of first touch control electrodes 132 may be arranged in a plurality of rows of touch driving electrodes and a plurality of columns of touch sensing electrodes. At the touch detection stage, the touch detection circuit (not drawn) may apply a touch driving signal to the touch driving electrodes, and then acquire a touch sensing signal from the touch sensing electrodes. The touch detection circuit may determine the touch position according to the touch driving signal and the touch sensing signal.

When bending the flexible display device, the internal stress of the flexible insulating blocks 121 may be substantially small and, meanwhile, the stress between the flexible insulating blocks 121 and the first touch control electrodes 132 may also be substantially small. Thus, the various layers in the flexible display device may be less likely to fall off, and the cracks in the flexible insulating layer 120 may be suppressed.

In another embodiment, the touch control unit may be a touch control unit based on self-capacitance or based on both mutual capacitance and self-capacitance, which is not limited by the present disclosure.

The present disclosure also provides exemplary flexible display devices in which the structure of the flexible insulating layer and touch control unit are different from the structure of the flexible insulating layer and touch control unit shown FIGS. 2A-5E. The similarities of the flexible display devices are not repeated here, while certain difference may be explained.

FIGS. 7A-7D illustrate schematic top views of exemplary flexible display devices consistent with disclosed embodiments. The similarities between FIGS. 7A-7D and FIGS. 2A-5E are not repeated here, while certain difference may be explained.

As shown in FIGS. 7A-7D, the touch control unit may be a touch control unit based on mutual capacitance. The touch control unit may include a first touch control electrode layer 131 and a second touch control electrode layer 135 stacked together. The first touch control electrode layer 131 and the second touch control electrode layer 135 may be electrically insulated from each other. The first touch control electrode layer 131 may include a plurality of first touch control electrodes 132 extending in a first direction and arranged in a second direction. The second touch control electrode layer 135 may include a plurality of second touch control electrodes 136 extending in the second direction and arranged in the first direction. The first direction may intersect the second direction, i.e., the first touch control electrode 132 may intersect or cross the second touch control electrode 136. The first touch control electrode 132 may be made of ITO. The second touch control electrode 136 may be made of ITO.

Figure 7A:
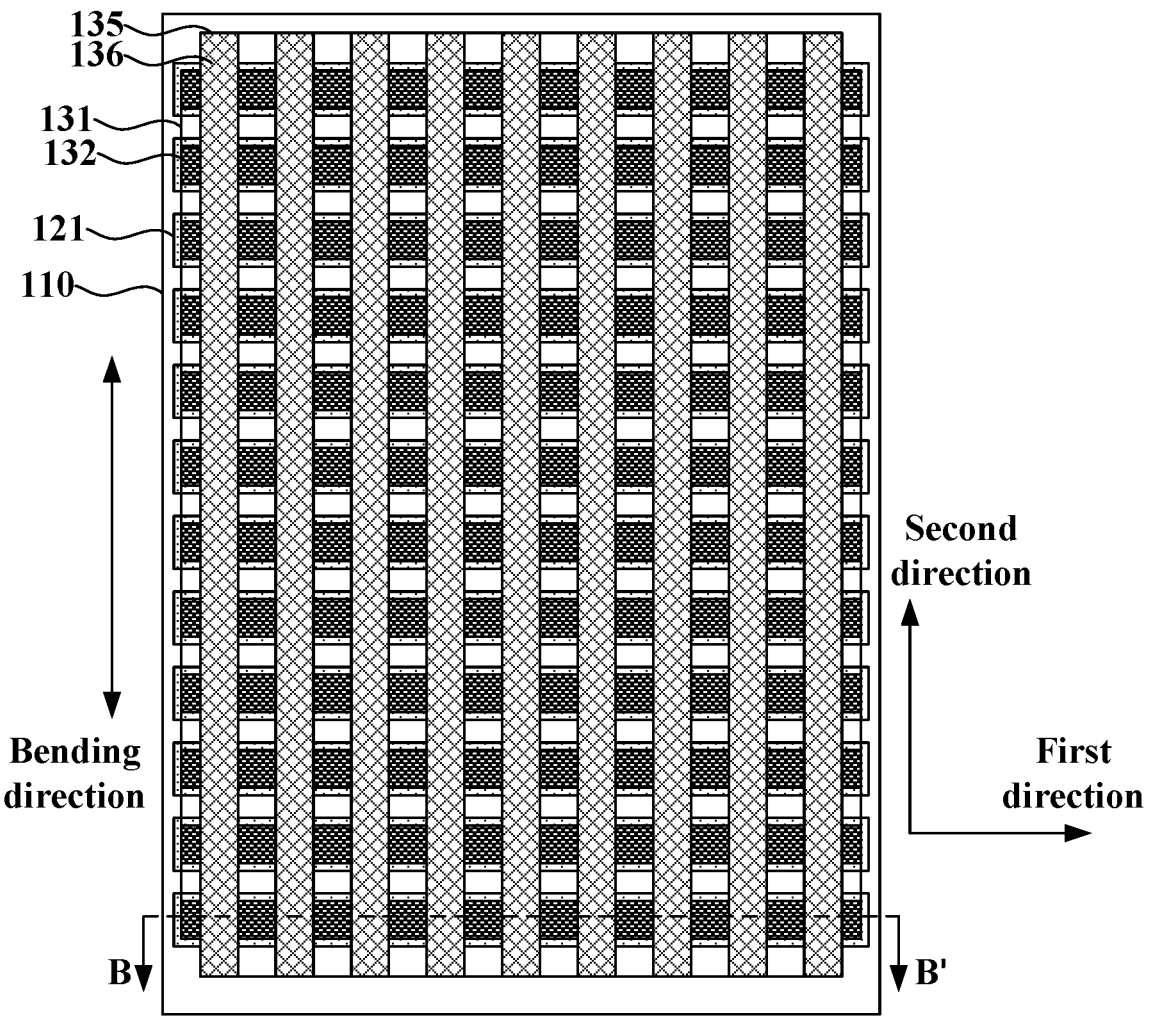
FIGS. 7A-7D illustrate schematic views of exemplary flexible display devices consistent with disclosed embodiments.
Figure 7B:
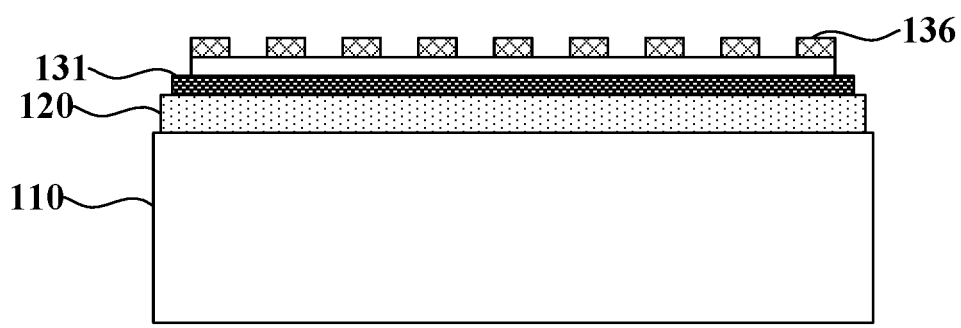

FIG. 7B illustrates a BB'-sectional view of an exemplary flexible display device in FIG. 7A consistent with disclosed embodiments. As shown in FIGS. 7A-7B, in the flexible display device, a plurality of flexible insulating blocks 121 may be flexible insulating stripes 121 extending in the first direction and arranged in the second direction. The first direction may be perpendicular to the second direction, and the first direction may be perpendicular to the bending direction of the flexible display device. One flexible insulating block 121 may correspond to one first touch control electrode 132. That is, the plurality of flexible insulating blocks 121 may be one-to-one corresponding to the plurality of first touch control electrodes 132.

Figure 7C:
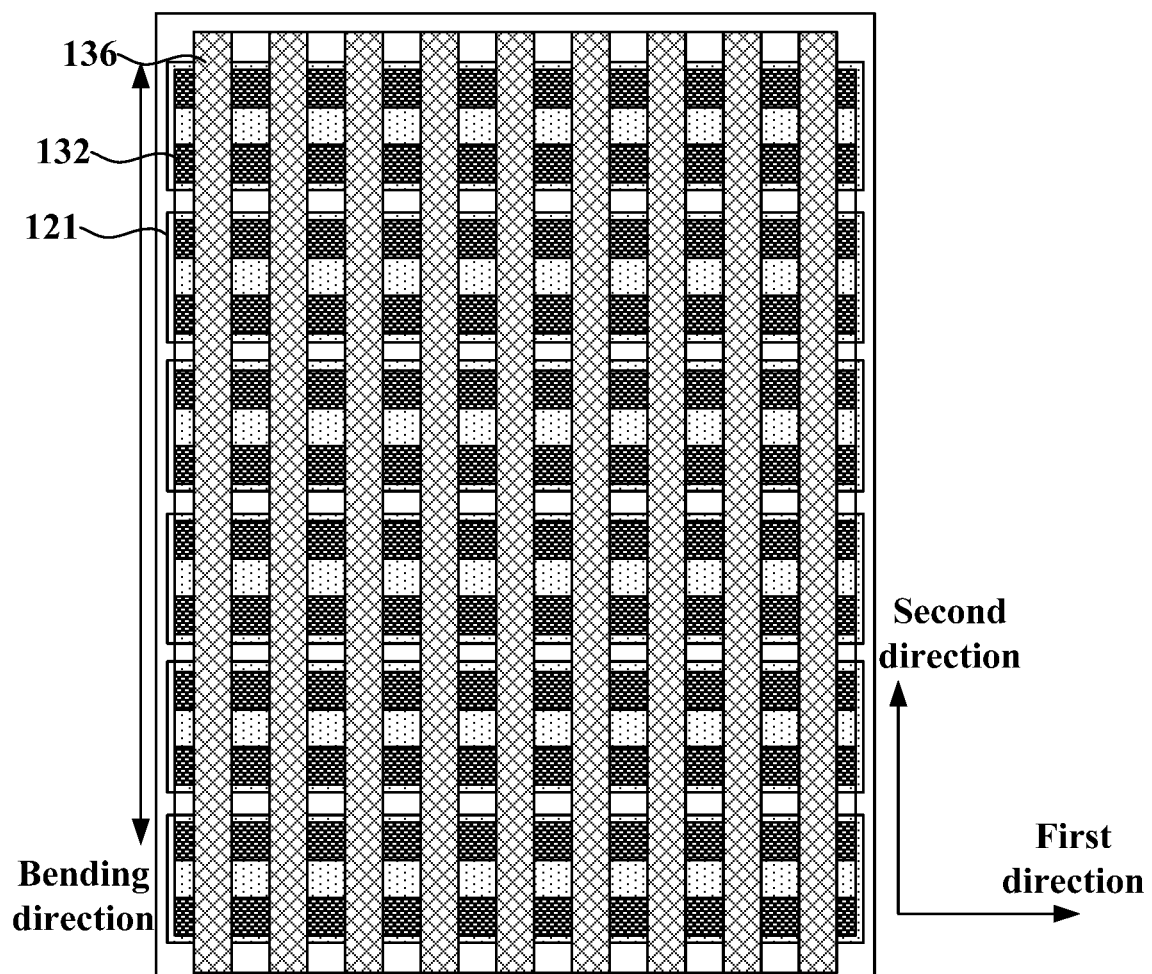

As shown in FIG. 7C, in the flexible display device, a plurality of flexible insulating blocks 121 may be flexible insulating stripes 121 extending in the first direction and arranged in the second direction. The first direction may be perpendicular to the second direction, and the first direction may be perpendicular to the bending direction of the flexible display device. One flexible insulating block 121 may correspond to more than one first touch control electrodes 132.

Figure 7D:
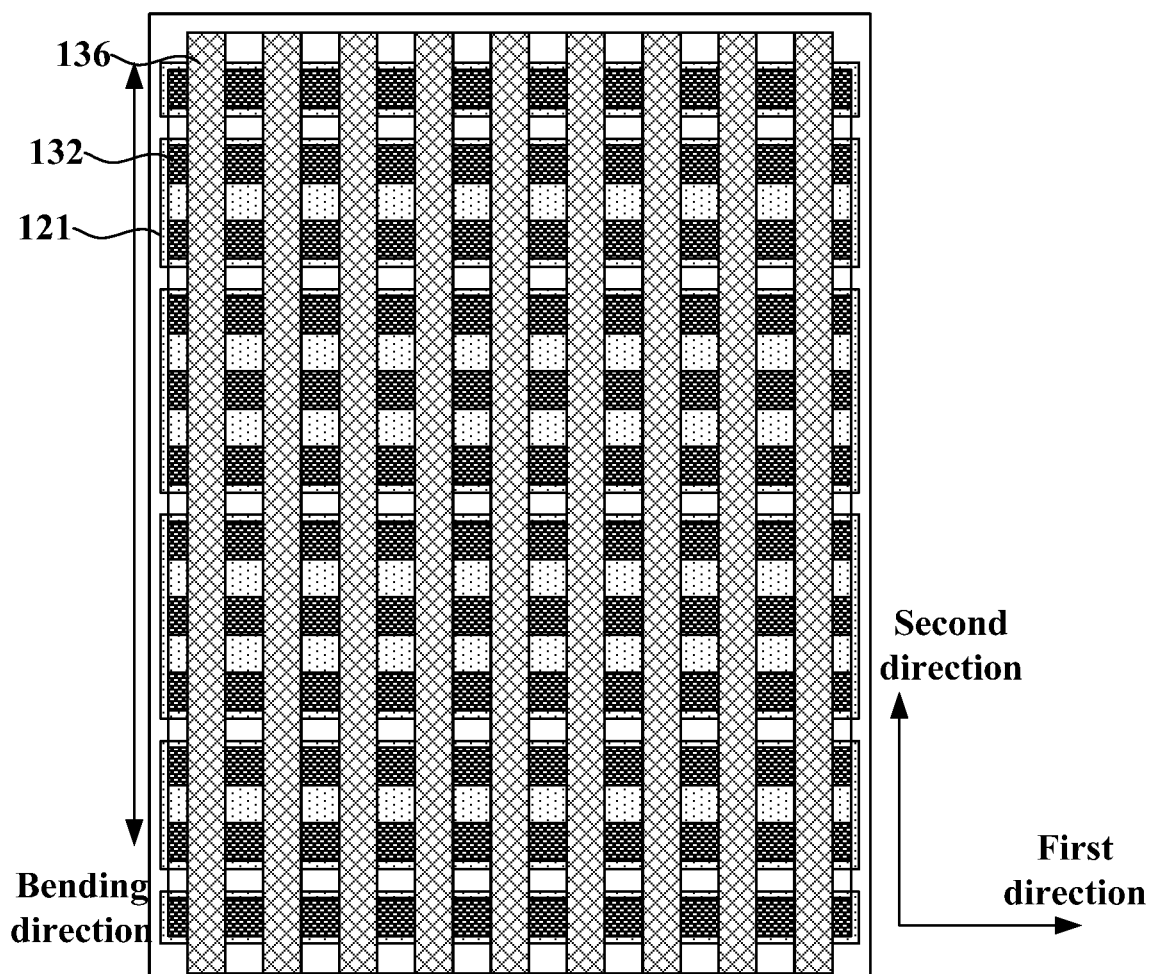

As shown in FIG. 7D, in the flexible display device, a plurality of flexible insulating blocks 121 may be flexible insulating stripes 121 extending in the first direction and arranged in the second direction. The first direction may be perpendicular to the second direction, and the first direction may be perpendicular to the bending direction of the flexible display device. One flexible insulating block 121 may correspond to at least two first touch control electrodes 132. Each flexible insulating block 121 may correspond to a different number of first touch control electrodes 132.

In the display panels shown in FIGS. 7A-7D, the touch control unit may be a touch control unit based on mutual capacitance. In particular, the touch control unit may include the first touch control electrode layer 131 and the second touch control electrode layer 135. The first touch control electrodes 132 in the first touch control electrode layer 131 may be configured as the touch driving electrodes, and the second touch control electrodes 136 in the second touch control electrode layer 135 may be configured as the touch sensing electrodes.

At the touch detection stage, the touch detection circuit (not drawn) may apply a touch driving signal to the touch driving electrodes, and then acquire a touch sensing signal from the touch sensing electrodes. The touch detection circuit may determine the touch position according to the touch driving signal and the touch sensing signal.

In addition, when bending the flexible display device, the internal stress of the flexible insulating blocks 121 may be substantially small and, meanwhile, the stress between the flexible insulating blocks 121 and the first touch control electrodes 132 may also be substantially small. Thus, the various layers in the flexible display device may be less likely to fall off, and the cracks in the flexible insulating layer 120 may be suppressed.

In another embodiment, the touch control unit may be a touch control unit based on self-capacitance or based on both mutual capacitance and self-capacitance, which is not limited by the present disclosure.

The present disclosure also provides exemplary flexible display devices in which the structure of the flexible insulating layer and touch control unit are different from the structure of the flexible insulating layer and touch control unit shown FIGS. 2A-7D. The similarities of the flexible display devices are not repeated here, while certain difference may be explained.

Figure 8A:
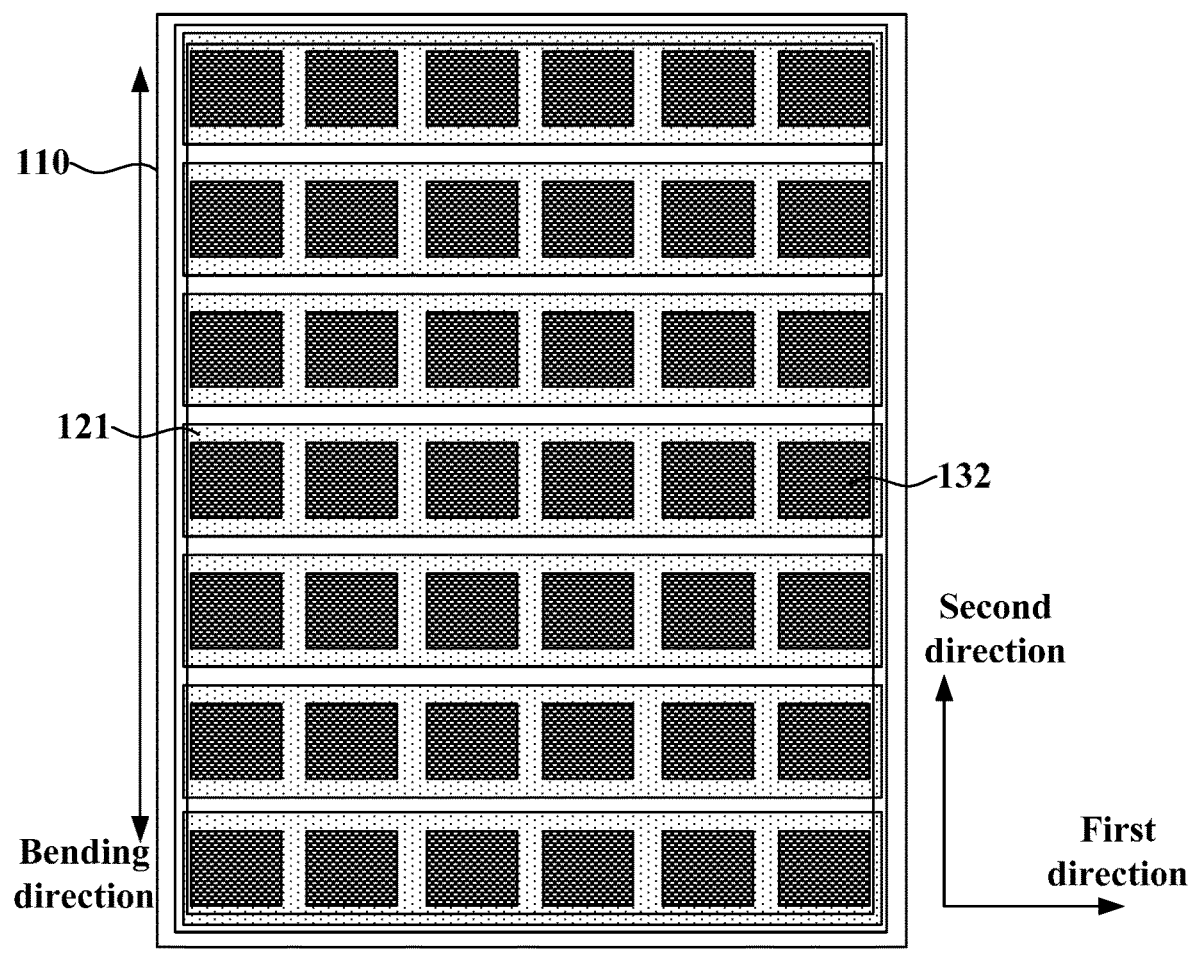
FIGS. 8A-8C illustrate schematic top views of exemplary flexible display devices consistent with disclosed embodiments.
Figure 8B:
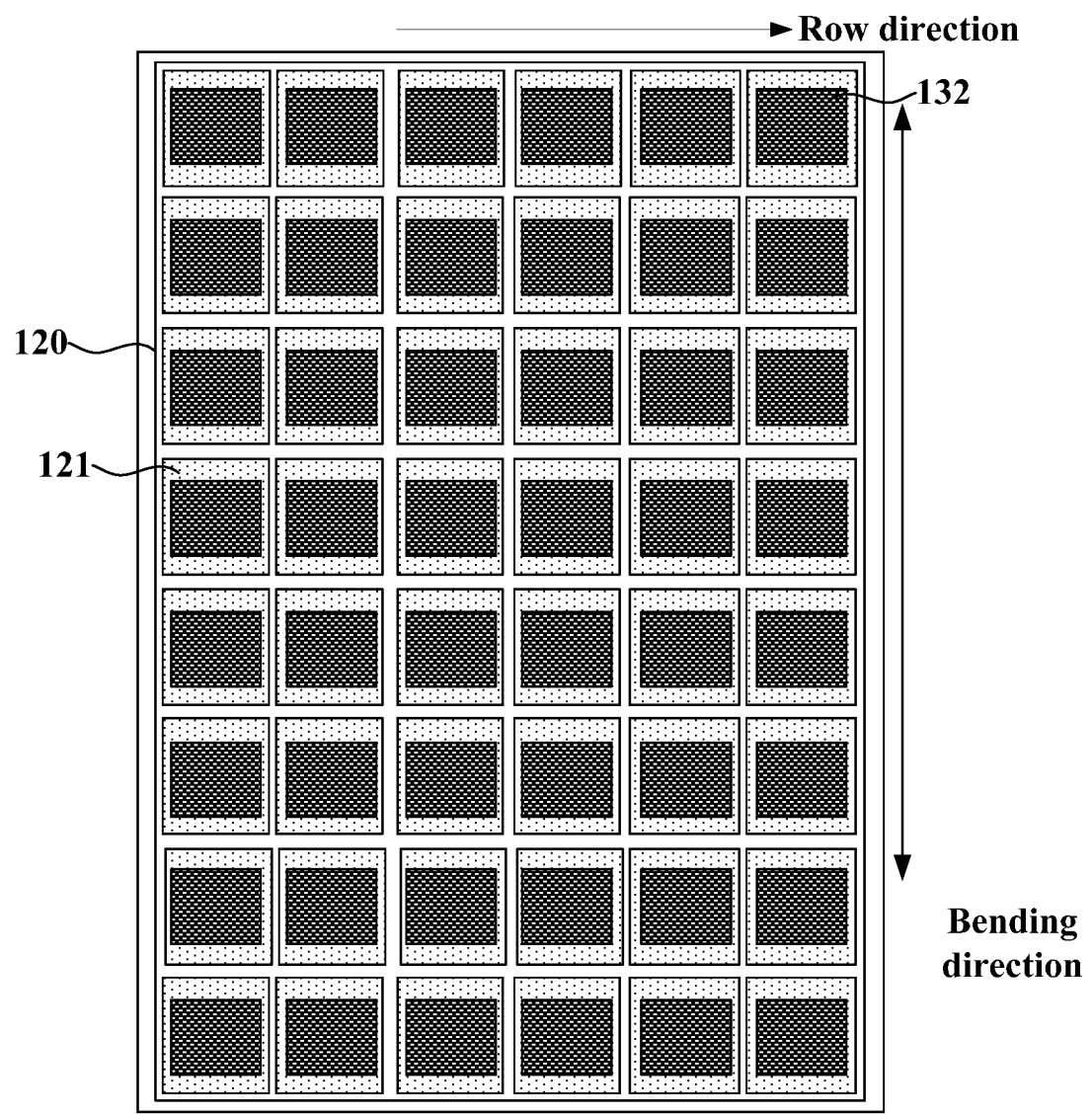
Figure 8C:
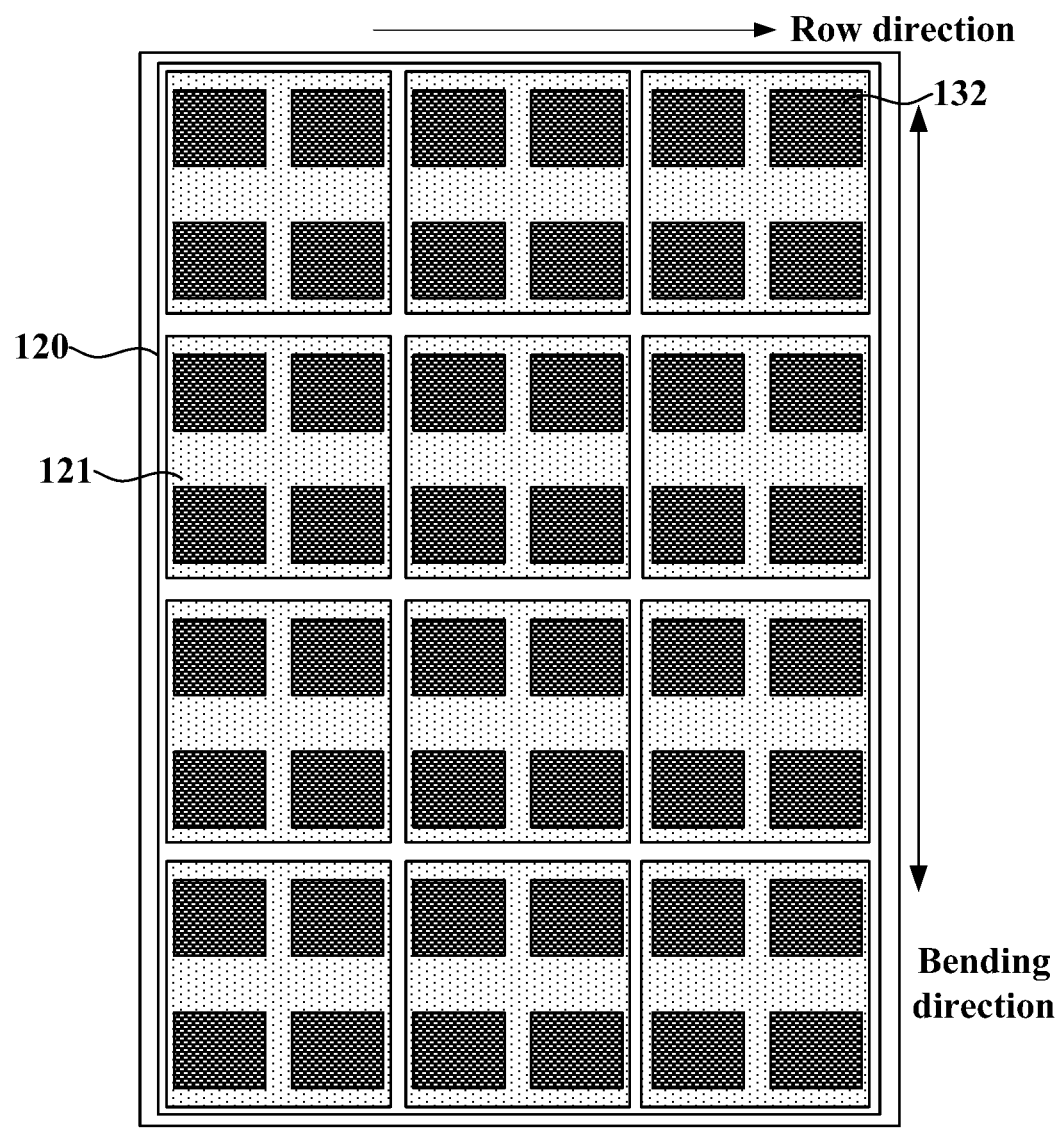

FIGS. 8A-8C illustrate schematic top views of exemplary flexible display devices consistent with disclosed embodiments. The similarities between FIGS. 8A-8C and FIGS. 2A-7D are not repeated here, while certain difference may be explained.

As shown in FIGS. 8A-8C, the touch control unit may be a touch control unit based on self-capacitance. The touch control unit may include a first touch control electrode layer 131, which may include a plurality of first touch control electrodes 132 arranged in an array. In one embodiment, the first touch control electrode 132 may be made of ITO.

As shown in FIG. 8A, in the flexible display device, a plurality of flexible insulating blocks 121 may be flexible insulating stripes 121 extending in a first direction and arranged in a second direction. The first direction may be perpendicular to the second direction, and the first direction may be perpendicular to the bending direction of the flexible display device. The plurality of first touch control electrodes 132 may be arranged in an array, and the row direction of the array may be perpendicular to the bending direction of the flexible display device. One flexible insulating block 121 may correspond to at least one row of first touch control electrodes 132. That is, one flexible insulating block 121 may correspond to at least one first touch control electrode row.

As shown in FIG. 8B, in the flexible display device, a plurality of flexible insulating blocks 121 may be arranged in an array, and the row direction of the array may be perpendicular to the bending direction of the flexible display device. One flexible insulating block 121 may correspond to one first touch control electrode 132.

As shown in FIG. 8C, in the flexible display device, a plurality of flexible insulating blocks 121 may be arranged in an array, and the row direction of the array may be perpendicular to the bending direction of the flexible display device. One flexible insulating block 121 may correspond to more than one first touch control electrodes 132.

In the display panels shown in FIGS. 8A-8C, the touch control unit may be a touch control unit based on self-capacitance. In particular, the touch control unit may comprise the first touch control electrode layer 131, which may include a plurality of first touch control electrodes 132. At the touch detection stage, the touch detection circuit (not drawn) may apply a touch driving signal to some first touch control electrodes 132, and then acquire a touch sensing signal from some other first touch control electrodes 132. The touch detection circuit may determine the touch position according to the touch driving signal and the touch sensing signal.

In addition, when bending the flexible display device, the internal stress of the flexible insulating blocks 121 may be substantially small and, meanwhile, the stress between the flexible insulating blocks 121 and the first touch control electrodes 132 may also be substantially small. Thus, the various layers in the flexible display device may be less likely to fall off, and the cracks in the flexible insulating layer 120 may be suppressed.

In another embodiment, the touch control unit may be a touch control unit based on mutual capacitance or based on both mutual capacitance and self-capacitance, which is not limited by the present disclosure.

Figure 9:
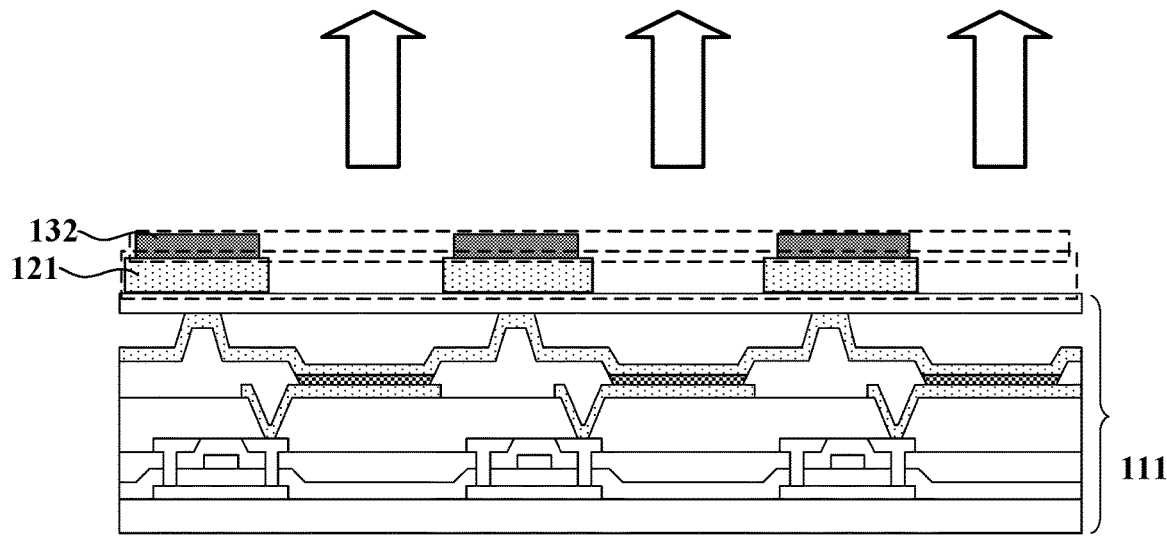
FIG. 9 illustrates a schematic cross-sectional view of another exemplary flexible display device consistent with disclosed embodiments.

FIG. 9 illustrates a schematic cross-sectional view of another exemplary flexible display device consistent with disclosed embodiments.

As shown in FIG. 9, the flexible display device may comprise a flexible display panel including a plurality of pixel regions. The pixel regions may be any appropriate unit of display for displaying images or an image element. For example, the pixel region may be a pixel or a subpixel of an image. Each pixel region may comprise a light-emitting region and a non-light-emitting region. The flexible insulating block 121 may be disposed in the non-light-emitting region, and the touch control electrode 132 in the touch control unit may be disposed on the flexible insulating block 121. The connecting lines between the first touch control electrodes 132 may also be connected through the non-light-emitting region.

Through disposing the flexible insulating block 121 in the non-light-emitting region of the pixel region, the light transmittance of the flexible display panel may not be degraded. In one embodiment, the first touch control electrode 132 may be made of ITO. In another embodiment, the first touch control electrode 132 may be a metal mesh.

Figure 10:
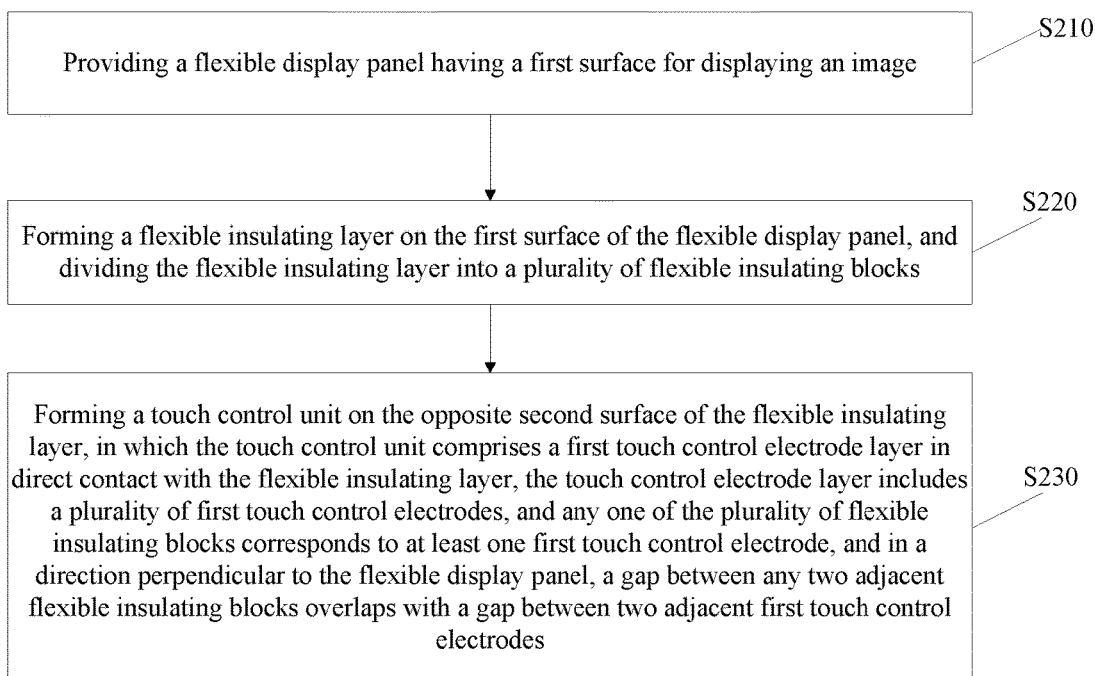
FIG. 10 illustrates a flow chart of an exemplary flexible display device fabrication method consistent with disclosed embodiments.

The present disclosure also provided a flexible display device fabrication method. FIG. 10 illustrates a flow chart of an exemplary flexible display device fabrication method consistent with disclosed embodiments.

As shown in FIG. 10, at the beginning, a flexible display panel having a first surface for displaying images is provided (S210). The corresponding structure is shown in FIG. 2B.

As shown in FIG. 2B, a flexible display panel 110 may be provided, which may include a first surface (i.e., a top surface of the flexible display panel 110 in FIG. 2B) for displaying images.

Returning to FIG. 10, after the flexible display panel is provided, a flexible insulating layer is formed on the first surface of the flexible display panel, and the flexible insulating layer is divided into a plurality of flexible insulating blocks (S220). The corresponding structure is shown in FIG. 2B.

As shown in FIG. 2B, a flexible insulating layer 120 may be formed on the first surface of the flexible display panel 110, and the flexible insulating layer 120 may be divided into a plurality of flexible insulating blocks 121. The flexible insulating layer 120 may have a first surface facing the flexible display panel 110 and an opposite second surface far away from the flexible display panel 110.

Returning to FIG. 10, after the flexible insulating layer is formed on the first surface of the flexible display panel 110, a touch control unit is formed on the opposite second surface of the flexible insulating layer (S230). The touch control unit comprises a first touch control electrode layer in direct contact with the flexible insulating layer. The touch control electrode layer includes a plurality of first touch control electrodes, and any one of the plurality of flexible insulating blocks corresponds to at least one first touch control electrode. In a direction perpendicular to the flexible display panel, a gap between any two adjacent flexible insulating blocks may overlap with a gap between two adjacent first touch control electrodes. The corresponding structure is shown in FIG. 2B.

As shown in FIG. 2B, a touch control unit comprising a first touch control electrode layer 131, which is in direct contact with the flexible insulating layer 120, may be formed on the opposite second surface of the flexible insulating layer 120. The touch control electrode layer 131 may include a plurality of first touch control electrodes 132, and any one of the plurality of flexible insulating blocks 121 may correspond to at least one first touch control electrode 132. In a direction perpendicular to the flexible display panel 110, a gap between any two adjacent flexible insulating blocks 121 may overlap with a gap between two adjacent first touch control electrodes 132.

Further, the flexible display panel 110 may comprise at least one display electrode layer (not drawn in FIG. 2B). The touch control unit may comprise the first touch control electrode layer 131, which may overlap with the display electrode layer in a direction perpendicular to the flexible display panel 110. That is, when being projected to the flexible display panel 110, the orthogonal projections of the display electrode layer and first touch control electrode layer 131 may overlap with each other. Thus, a parasitic capacitance may be generated between the display electrode layer and the first touch control electrode layer 131. The parasitic capacitance formed between the flexible display panel 110 and the touch control unit may result a substantially large load of the flexible display device.

To reduce the load of the flexible display device, the flexible insulating layer 120 may be disposed between the flexible display panel 110 and the touch control unit. On one hand, the flexible insulating layer 120 may not affect either the display function of the flexible display panel 110 or the touch control function of the touch control unit. On the other hand, the flexible insulating layer 120 may increase the distance between the flexible display panel 110 and the touch control unit, thereby reducing the parasitic capacitance between the flexible display panel 110 and the touch control unit and, accordingly, reducing the load of the flexible display device.

Further, to prevent the bending properties of the flexible display device from being affected, the flexible insulating layer 120 may be divided into a plurality of flexible insulating blocks 121, any one of the plurality of flexible insulating blocks 121 may correspond to at least one first touch control electrode 132. In a direction perpendicular to the flexible display panel 110, a gap between any two adjacent flexible insulating blocks 121 may overlap with a gap between two adjacent first touch control electrodes 132.

Thus, the internal stress of the flexible insulating blocks 121 may be substantially small, and the flexible insulating layer 120 may be less likely to crack. Meanwhile, when bending the flexible display device, the stress between the flexible insulating blocks 121 and the flexible display panel 110, as well as the stress between the flexible insulating blocks 121 and the first touch control electrodes 132 may also be substantially small, such that the various layers in the flexible display device may be less likely to fall off, and the bending performance of the flexible display device may be improved.

Figure 12A:
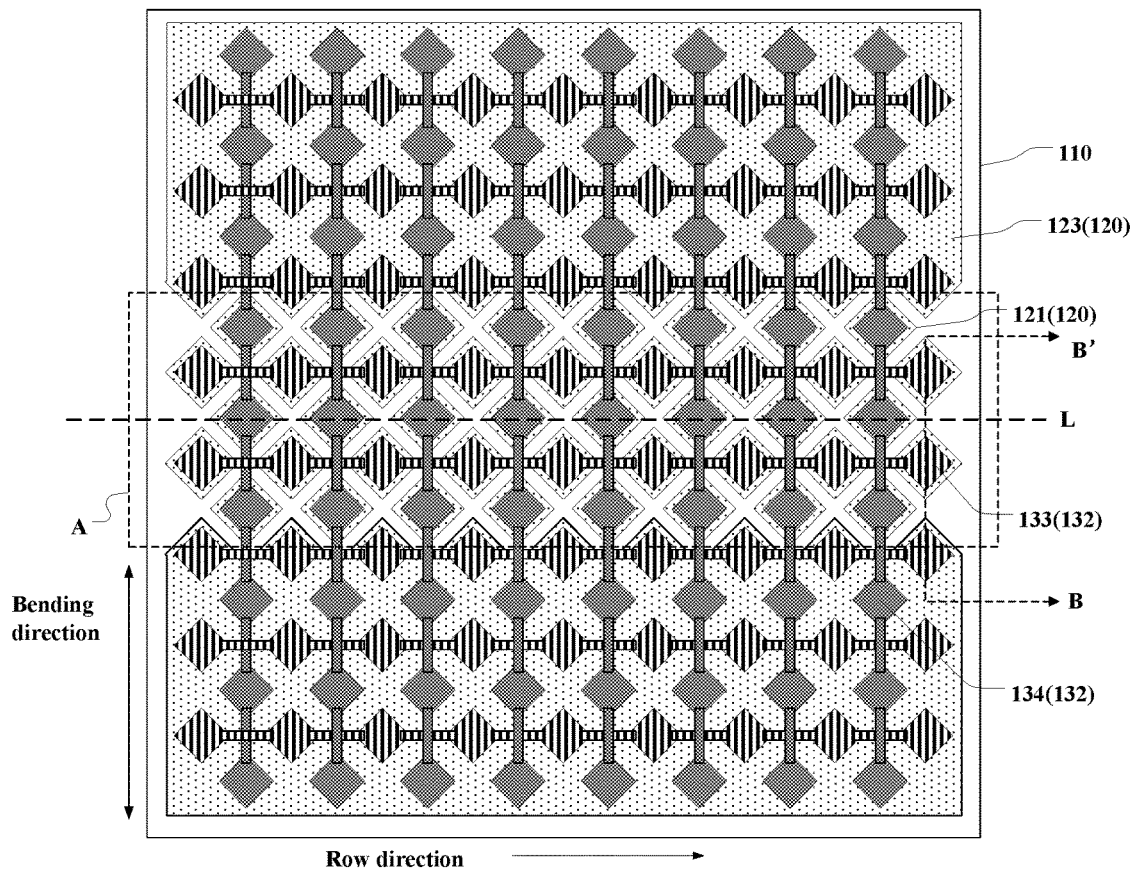
FIG. 12A illustrates a schematic top view of another exemplary flexible display device consistent with disclosed embodiments.
Figure 12B:
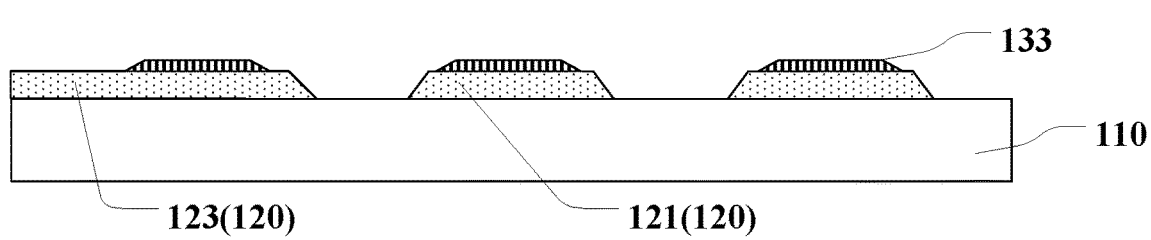
FIG. 12B illustrates BB'-sectional views of another exemplary flexible display device in FIG. 12A consistent with disclosed embodiments.

FIG. 12A illustrates a schematic top view of another exemplary flexible display device consistent with disclosed embodiments, and FIG. 12B illustrates BB'-sectional views of another exemplary flexible display device in FIG. 12A consistent with disclosed embodiments. As shown in FIG. 12A and FIG. 12B, the flexible display device may comprise a flexible display panel 110 having a first surface for displaying images, a flexible insulating layer 120 disposed on the first surface of the flexible display panel 110, and a touch control unit comprising a first touch control electrode layer 131 in direct contact with the flexible insulating layer 120. The flexible insulating layer 120 may include a plurality of flexible insulating blocks 121 and at least one flexible insulating pad 123. The flexible insulating layer 120 may have a first surface facing the flexible display panel 110 and an opposite second surface far away from the flexible display panel 110. The touch control unit may be disposed on the second surface of the flexible insulating layer 120.

The touch control electrode layer 131 may include a plurality of first touch control electrodes 132, which form a plurality of rows of drive electrodes 133 and a plurality of columns of sensing electrodes 134. In particular, the flexible display device may include a bending area A provided with a bending axis L. The flexible display device may be bent along the bending axis L, where a bending direction is perpendicular to an extending direction of the bending axis L. In the bending area A, any one of the plurality of flexible insulating blocks 121 may correspond to at least one first touch electrode 132, and in a plane of the first surface for displaying images and in a direction perpendicular to the bending axis L, a gap between any two adjacent flexible insulating blocks 121 may overlap with a gap between two adjacent first touch control electrodes 132.

That is, when being projected onto the first surface, the orthogonal projection of the gap between any two adjacent flexible insulating blocks 121 may overlap with the orthogonal projection of the gap between two adjacent first touch control electrodes 132. In one embodiment, as shown in FIGS. 12A-12B, when being projected onto the first surface of the flexible display panel 110, the orthogonal projection of the gap between any two adjacent flexible insulating blocks 121 may fall within the orthogonal projection of the gap between two adjacent first touch control electrodes 132.

In an area other than the bending area A, the flexible insulating layer 120 may be connected together to form a whole flexible insulating pad 123. That is, in the non-bending area, the flexible insulating layer 123 may be configured as a whole flexible insulating pad without any gaps. In one embodiment, as shown in FIG. 12A and FIG. 12B, in the bending direction, two non-bending areas may be provided at two sides of the bending area A. In each non-bending area, the flexible insulating layer 123 may be configured as a whole flexible insulating pad without any gaps. In the bending area A, the flexible insulating layer 123 may be configured as a plurality of flexible insulating blocks 121 where a gap is disposed between any two adjacent insulating blocks 121.

In the disclosed embodiments, the flexible insulating layer 120 may be disposed between the flexible display panel 110 and the touch control unit. On one hand, the flexible insulating layer 120 may not affect the display function of the flexible display panel 110 and the touch control function of the touch control unit. On the other hand, the flexible insulating layer 120 may increase the distance between the flexible display panel 110 and the touch control unit, thereby reducing the parasitic capacitance between the flexible display panel 110 and the touch control unit and, accordingly, reducing the load of the flexible display device. In addition, the flexible insulating layer 120 may be configured to have different configurations in the bending area A and the non-bending area and, more particular, in the bending area A, the flexible insulating layer 120 may be divided into a plurality of flexible insulating blocks 121 where a gap is disposed between any two adjacent insulating blocks 121. Thus, the bending performance of the display device in the bending area may be further improved.

The flexible display panel 110 may be the same as other embodiments of the present disclosure, and details are not described herein again. It should be noted that, in certain embodiments of the present disclosure, a plurality of bending axes, i.e., a plurality of bending areas, may be configured in the flexible display panel 110. When a plurality of bending axes are configured in the flexible display panel 110, flexible insulating blocks may be disposed at a position corresponding to each bending axis. In the bending area A, any one of the flexible insulating blocks 121 may correspond to at least one first touch electrode 132, and when being projected onto the first surface of the flexible display panel 110, the orthogonal projection of the gap between any two adjacent flexible insulating blocks 121 may fall within the orthogonal projection of the gap between two adjacent first touch control electrodes 132. Thus, the parasitic capacitance between the flexible display panel 110 and the touch control unit may be reduced, the load of the flexible display device may be reduced, and the bending performance of the display device in the bending area may be improved.

In the disclosed embodiments, through disposing the flexible insulating layer between the first surface of the flexible display panel and the touch control unit, the distance between the flexible display panel and the touch control unit may be increased, thereby reducing the parasitic capacitance between the flexible display panel and the touch control unit and, accordingly, reducing the load of the flexible display device. Further, in the bending area, the flexible insulating layer may be divided into a plurality of flexible insulating blocks, any one of the plurality of flexible insulating blocks may correspond to at least one first touch control electrode. In a direction perpendicular to the first surface flexible display panel, the gap between any two adjacent flexible insulating blocks may fall within the gap between two adjacent first touch control electrodes. When bending the flexible display device, the internal stress of the flexible insulating blocks, the stress between the flexible insulating block and the flexible display panel, and the stress between the flexible insulating block and the first touch electrode may be all substantially small. Thus, the peeling risk of various layers in the flexible display device may be reduced, and the cracking of the flexible insulating layer may be suppressed. Meanwhile, the flexible display device may be able to reduce the load without affecting the bending performance.

For illustrative purposes, the bending direction in FIG. 12A is the vertical direction. In another embodiment, the bending direction may be the horizontal direction in FIG. 12A and the position of the bending area A may be adjusted accordingly, the details are not described herein again.

Figure 13:
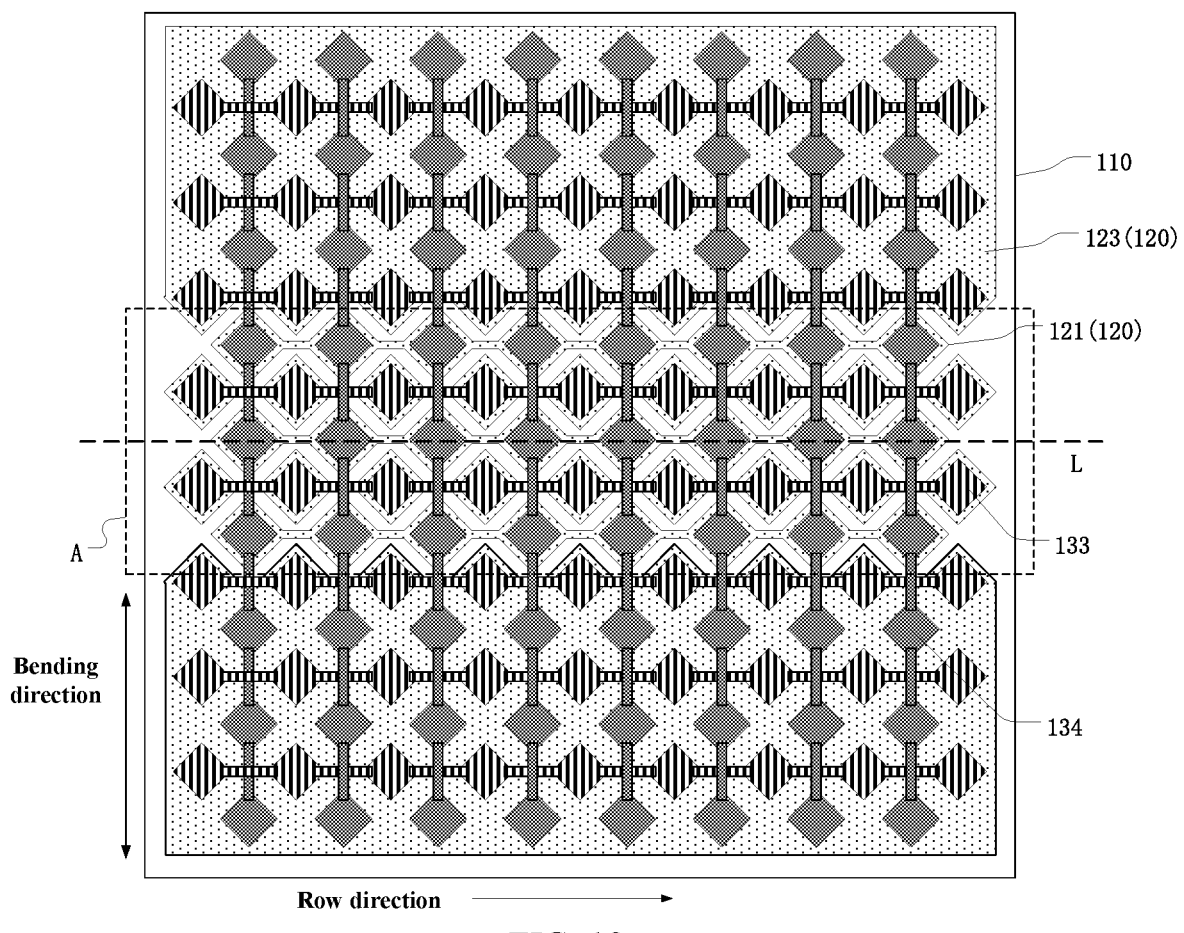
FIG. 13 illustrates a schematic top view of another exemplary flexible display device consistent with disclosed embodiments.

FIG. 13 illustrates a schematic top view of another exemplary flexible display device consistent with disclosed embodiments. The similarities between FIG. 12A and FIG. 13 are not repeated here, while certain difference may be explained.

As shown in FIG. 13, the flexible insulating layer 120 may be divided into a plurality of flexible insulating blocks 121. The plurality of flexible insulating blocks 121 may be flexible insulating stripes 121 extending in a first direction and arranged in a second direction. The first direction may be perpendicular to the second direction, and the first direction may be perpendicular to the bending direction of the flexible display device, i.e., the first direction may be parallel to the bending axis L. The plurality of first touch electrodes 132 may be arranged in an array, where a row direction of the array may be perpendicular to the bending direction of the flexible display device. One flexible insulating block 121 may correspond to at least one row of the first touch electrodes 132.

In the disclosed embodiments, the flexible insulating block 121 located in the bending area A may be flexible insulating stripes, however, in a plane of the first surface for displaying images and in a direction perpendicular to the bending axis L, the gap between any two adjacent flexible insulating blocks 121 may fall within the gap between two adjacent first touch electrodes 132. When bending the flexible display device, the internal stress of the flexible insulating blocks may be substantially small, such that the flexible insulating layer 120 may be less likely to crack. Meanwhile, the stress between the flexible insulating blocks 121 and the flexible display panel 110, as well as the stress between the flexible insulating blocks 121 and the first touch control electrodes 132 may be substantially small, such that the various layers in the flexible display device may be less likely to fall off, and the bending performance of the display device in the bending area may be enhanced.

The flexible insulating layer in the non-bending area may be configured in the same manner as the flexible insulating layer of the embodiment shown in FIG. 12A, i.e., the flexible insulating layer in the non-bending area may be configured as a whole flexible insulating pad. It should be noted that, in another embodiment, in the non-bending area, the flexible insulating layer may be configured as flexible insulating blocks independent of each other, which is not limited by the present disclosure.

Figure 14:
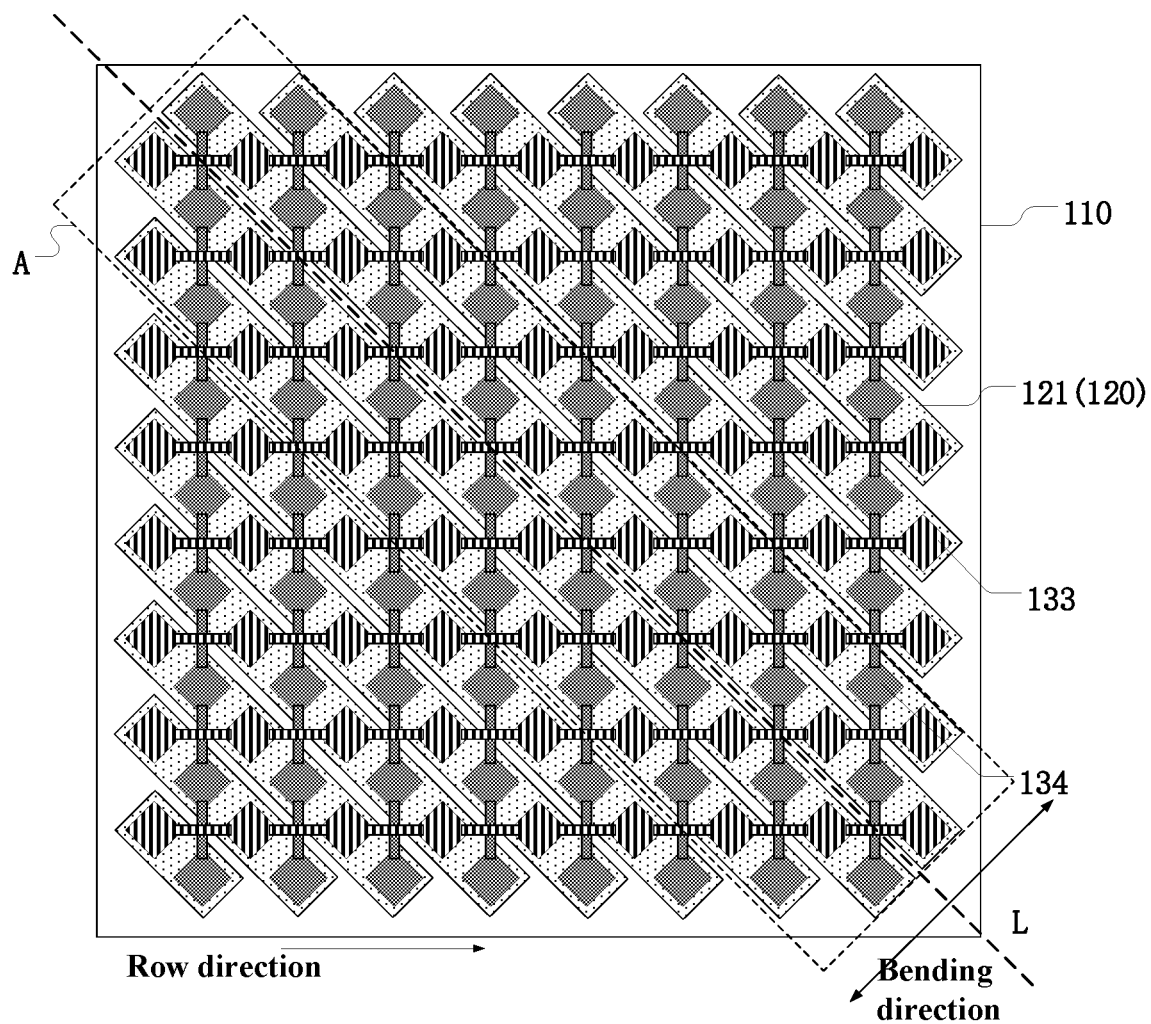
FIG. 14 illustrates a schematic top view of another exemplary flexible display device consistent with disclosed embodiments.

FIG. 14 illustrates a schematic top view of another exemplary flexible display device consistent with disclosed embodiments. The similarities between FIG. 12A and FIG. 14 are not repeated here, while certain difference may be explained.

As shown in FIG. 14, the flexible display device may include a bending area A which is provided with a bending axis L. The bending axis L may be neither parallel to the row direction nor perpendicular to the row direction. The flexible insulating layer 120 may include a plurality of flexible insulating blocks 121. The plurality of flexible insulating blocks 121 may be flexible insulating stripes 121 extending in a direction parallel to the bending axis L and arranged in a direction perpendicular to the extending direction of the bending axis L.

In the disclosed embodiments, the flexible insulating block 121 located in the bending area A may be flexible insulating stripes, however, in a plane of the first surface for displaying images and in a direction perpendicular to the bending axis L, the gap between any two adjacent flexible insulating blocks 121 may fall within the gap between two adjacent first touch electrodes 132. When bending the flexible display device, the internal stress of the flexible insulating blocks may be substantially small, such that the flexible insulating layer 120 may be less likely to crack. Meanwhile, the stress between the flexible insulating blocks 121 and the flexible display panel 110, as well as the stress between the flexible insulating blocks 121 and the first touch control electrodes 132 may be substantially small, such that the various layers in the flexible display device may be less likely to fall off, and the bending performance of the display device in the bending area may be enhanced.

Further, the flexible insulating layer 120 in the non-bending area may also be configured as flexible insulating stripes, which is not limited by the present disclosure. In certain embodiments, the flexible insulating layer 120 in the non-bending area may be configured as a whole flexible insulating block.

Figure 15:
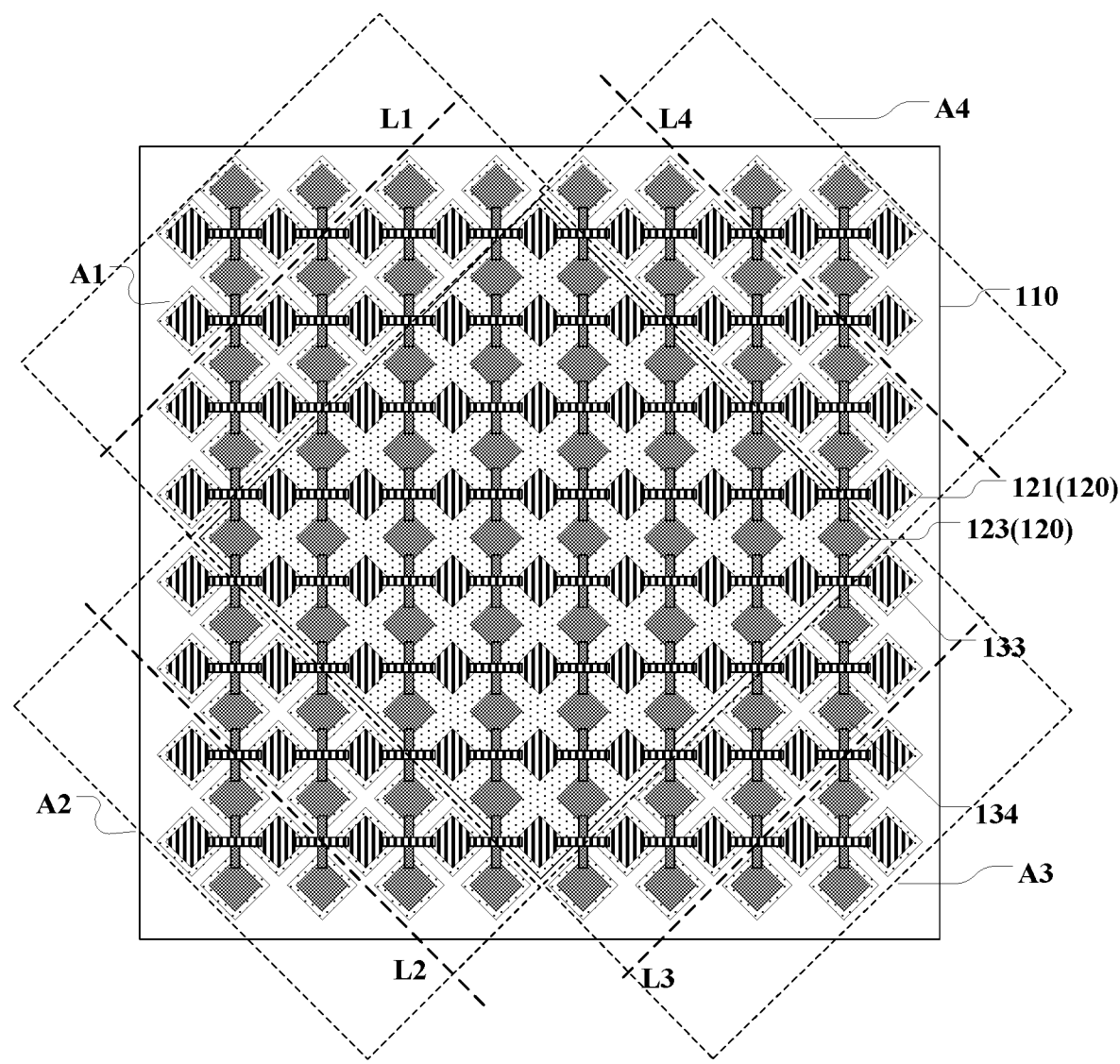
FIG. 15 illustrates a schematic top view of another exemplary flexible display device consistent with disclosed embodiments.

FIG. 15 illustrates a schematic top view of another exemplary flexible display device consistent with disclosed embodiments. The similarities between FIG. 12A and FIG. 15 are not repeated here, while certain difference may be explained.

As shown in FIG. 15, the flexible display device may include four bending areas: a first bending area A1, a second bending area A2, a third bending area A3 and a fourth bending area A4. Each bending area may be provided with a bending axis, i.e., the first bending area A1, the second bending area A2, the third bending area A3 and the fourth bending area A4 may be provided with a first bending axis L1, a second bending axis L2, a third bending axis L3 and a fourth bending axis L4, respectively. The four bending axes L1 to L4 may be neither parallel to the row direction nor perpendicular to the row direction. In each of the bending areas, the flexible insulating layer 120 may include a plurality of flexible insulating blocks 121, and the plurality of flexible insulating blocks 121 may be one-to-one corresponding to the plurality of first touch electrodes 132.

In any one of the bending areas, in a plane of the first surface for displaying images and in a direction perpendicular to the bending axis L, the gap between any two adjacent flexible insulating blocks 121 may fall within the gap between two adjacent first touch electrodes 132. When bending the flexible display device, the internal stress of the flexible insulating blocks may be substantially small, such that the flexible insulating layer 120 may be less likely to crack. Meanwhile, the stress between the flexible insulating blocks 121 and the flexible display panel 110, as well as the stress between the flexible insulating blocks 121 and the first touch control electrodes 132 may be substantially small, such that the various layers in the flexible display device may be less likely to fall off, and the bending performance of the display device in the bending area may be enhanced.

In certain embodiments, when the flexible display device includes a plurality of bending areas, as long as in a plane of the first surface for displaying images and in a direction perpendicular to the bending axis L, the gap between any two adjacent flexible insulating blocks 121 is configured to fall within the gap between two adjacent first touch electrodes 132, the technical efforts of reducing the stress may be achieved.

Figure 11:
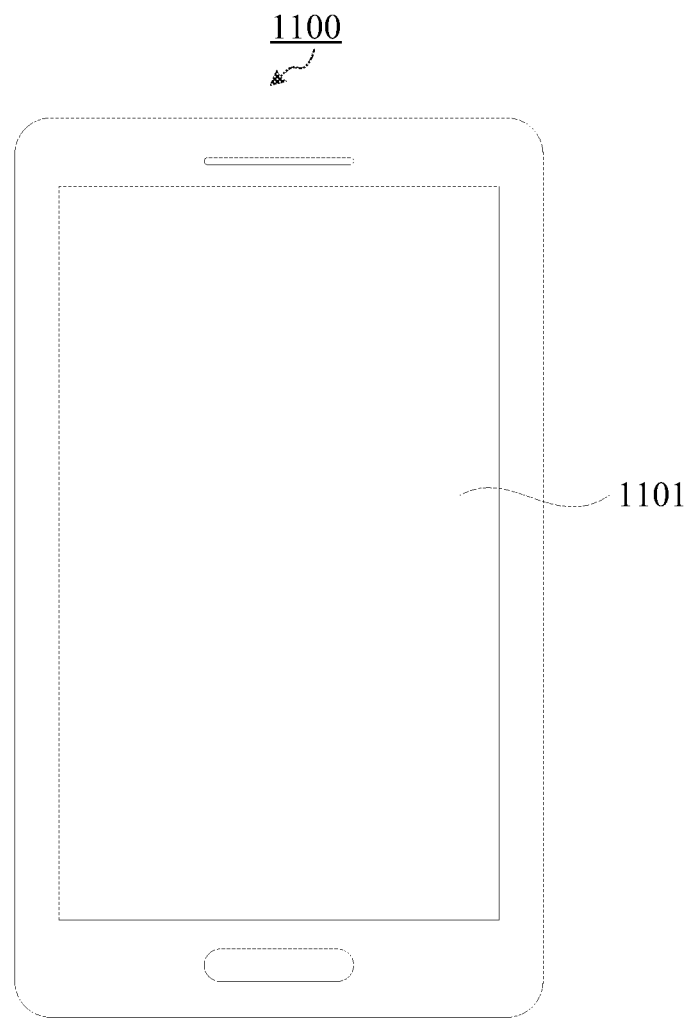
FIG. 11 illustrates an exemplary electronic device consistent with disclosed embodiments.

The present disclosure also provides an electronic device comprising any one of the disclosed flexible display devices. FIG. 11 illustrates an exemplary electronic device consistent with disclosed embodiments.

As shown in FIG. 11, the electronic device 1100 may comprise a flexible display device 1101, which may be any one of the disclosed flexible display devices. The electronic device 1100 may be a flexible electronic device. The electronic device 1100 may be a smart phone, a tablet, and a wearable electronic device, etc., which is not limited by the present disclosure.

In the disclosed embodiments, the flexible insulating layer may be disposed between the first surface of the flexible display panel and the touch control unit. The flexible insulating layer may increase the distance between the flexible display panel and the touch control unit, thereby reducing the parasitic capacitance between the flexible display panel and the touch control unit and, accordingly, reducing the load of the flexible display device.

Further, the flexible insulating layer may be divided into a plurality of flexible insulating blocks, any one of the plurality of flexible insulating blocks may correspond to at least one first touch control electrode. In a direction perpendicular to the flexible display panel, a gap between any two adjacent flexible insulating blocks may overlap with a gap between two adjacent first touch control electrodes.

When bending the flexible display device, the internal stress of the flexible insulating blocks, the stress between the flexible insulating blocks and the flexible display panel, as well as the stress between the flexible insulating blocks and the first touch control electrodes may be substantially small. Thus, the various layers in the flexible display device may be less likely to fall off, the cracks in the flexible insulating layer may be suppressed, and the overall bending performance of the flexible display device may be improved.

The flexible display device may be able to reduce the load of the flexible display device without degrading the bending performance of the flexible display device.

It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments, but may be embodied in other equivalent forms without departing from the scope of the present disclosure, which is determined by the appended claims.

What is claimed is:

1. A flexible display device, comprising:
   at least one bending area and a non-bending area, wherein the bending area is provided with a bending axis;
   a flexible display panel having a first surface for displaying images;
   a flexible insulating layer disposed on the first surface of the flexible display panel, wherein in the at least one bending area, the flexible insulating layer is divided into a plurality of flexible insulating blocks, and the flexible insulating layer has a first surface facing the flexible display panel and an opposite second surface; and
   a touch control unit disposed on the second surface of the flexible insulating layer, wherein the touch control unit comprises a first touch control electrode layer in direct contact with the flexible insulating layer, and the first touch control electrode layer includes a plurality of first touch control electrodes,
   wherein any one of the plurality of flexible insulating blocks corresponds to at least one of the plurality of first touch control electrodes, and
   in a plane of the first surface and in a direction perpendicular to the bending axis, a gap between any two adjacent flexible insulating blocks overlaps with a gap between two adjacent first touch control electrodes.

2. The flexible display device according to claim 1, wherein:
   the plurality of flexible insulating blocks are extending in a first direction and arranged in a second direction,
   the first direction is perpendicular to the second direction, and
   the first direction is perpendicular to a bending direction of the flexible display device.

3. The flexible display device according to claim 2, wherein:
   the plurality of first touch control electrodes are arranged in an array including a plurality of first touch control electrode rows;
   a row direction of the array is perpendicular to the bending direction of the flexible display device; and
   a flexible insulating block corresponds to at least one of the plurality of first touch control electrode rows.

4. The flexible display device according to claim 2, wherein:
   the plurality of first touch control electrodes are arranged in an array including a plurality of first touch control electrode columns;
   a column direction of the array is perpendicular to the bending direction of the flexible display device; and
   a flexible insulating block corresponds to at least one of the plurality of first touch control electrode columns.

5. The flexible display device according to claim 1, wherein:
   the plurality of first touch control electrodes are arranged in an array; and
   a column direction or a row direction of the array is perpendicular to a bending direction of the flexible display device.

6. The flexible display device according to claim 5, wherein:
   the plurality of flexible insulating blocks are one-to-one corresponding to the plurality of first touch control electrodes.

7. The flexible display device according to claim 1, wherein:
   a first touch control electrode is made of indium tin oxide (ITO).

8. The flexible display device according to claim 1, wherein:
   a first touch control electrode is a metal grid including a plurality of openings.

9. The flexible display device according to claim 8, wherein:
the flexible insulating block includes a plurality of grooves extending through the flexible insulating block; and
in the direction perpendicular to the flexible display panel, a groove falls within an opening of the metal grid.

10. The flexible display device according to claim 1, wherein:
the flexible insulating layer comprises an organic material.

11. The flexible display device according to claim 10, wherein:
the organic material is polymethylmethacrylate.

12. The flexible display device according to claim 1, wherein:
the flexible insulating layer has a thickness of approximately 4 μm to 20 μm.

13. The flexible display device according to claim 1, wherein:
the flexible display panel is an organic light-emitting diode (OLED) display panel.

14. The flexible display device according to claim 13, wherein:
the flexible display panel comprises a plurality of light-emitting units, and a thin film encapsulation layer configured to encapsulate the plurality of light-emitting units.

15. The flexible display device according to claim 1, wherein:
the flexible display panel comprises a plurality of bending areas each provided with a bending axis; and
in each of the plurality of bending areas, in the direction perpendicular to the first surface, a gap between any two adjacent flexible insulating blocks overlaps with a gap between two adjacent first touch control electrodes.

16. The flexible display device according to claim 1, wherein:
in the non-bending area, the flexible insulating layer is configured as a whole flexible insulating pad.

17. The flexible display device according to claim 3, wherein:
an extending direction of the bending axis is neither parallel to a row direction of the array nor parallel to a column direction of the array.

* * * * *